(12) United States Patent
Chun et al.

(10) Patent No.: US 12,302,580 B2
(45) Date of Patent: May 13, 2025

(54) SEMICONDUCTOR DEVICES AND DATA STORAGE SYSTEMS INCLUDING THE SAME

(71) Applicant: Samsung Electronics Co., Ltd., Suwon-si (KR)

(72) Inventors: Sanghun Chun, Suwon-si (KR); Jihwan Kim, Suwon-si (KR); Shinhwan Kang, Suwon-si (KR); Jeehoon Han, Hwaseong-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 692 days.

(21) Appl. No.: 17/231,600

(22) Filed: Apr. 15, 2021

(65) Prior Publication Data

US 2022/0045084 A1    Feb. 10, 2022

(30) Foreign Application Priority Data

Aug. 10, 2020    (KR) .................. 10-2020-0100043

(51) Int. Cl.
*H10B 43/50*    (2023.01)
*H01L 21/768*    (2006.01)
(Continued)

(52) U.S. Cl.
CPC ....... *H10B 43/50* (2023.02); *H01L 21/76805* (2013.01); *H01L 21/76895* (2013.01);
(Continued)

(58) Field of Classification Search
None
See application file for complete search history.

(56) References Cited

U.S. PATENT DOCUMENTS 9,917,093 B2    3/2018    Chu et al.
9,985,040 B2    5/2018    Daycock
(Continued)

FOREIGN PATENT DOCUMENTS

JP    2019-087747 A    6/2019
JP    2019-220534 A    12/2019
(Continued)

OTHER PUBLICATIONS

German Office Action dated Jul. 9, 2024 for corresponding German Patent Application No. 102021113524.9 with its English-language translation.
(Continued)

*Primary Examiner* — Shaun M Campbell
*Assistant Examiner* — Carnell Hunter, III
(74) *Attorney, Agent, or Firm* — Harness, Dickey & Pierce, P.L.C.

(57) ABSTRACT

A semiconductor memory device includes a first substrate; active or passive circuits on the first substrate; a second substrate above the active or passive circuits; gate electrodes stacked on the second substrate to be spaced apart from each other in a first direction; channel structures penetrating through the gate electrodes and extending in the first direction, and each including a channel layer; separation regions penetrating through the gate electrodes and extending in a second direction; a through-contact plug extending through the second substrate in the first direction and electrically connecting the gate electrodes and the active or passive circuits to each other; and a barrier structure spaced apart from the through-contact plug and surrounding the through-contact plug and having first regions each having a first width, and second regions each having a second width greater than the first width.

19 Claims, 35 Drawing Sheets

(51) Int. Cl.
  *H01L 23/535* (2006.01)
  *H10B 41/27* (2023.01)
  *H10B 41/41* (2023.01)
  *H10B 41/50* (2023.01)
  *H10B 43/27* (2023.01)
  *H10B 43/40* (2023.01)

(52) U.S. Cl.
  CPC ........... *H01L 23/535* (2013.01); *H10B 41/27* (2023.02); *H10B 41/41* (2023.02); *H10B 41/50* (2023.02); *H10B 43/27* (2023.02); *H10B 43/40* (2023.02)

(56) References Cited

U.S. PATENT DOCUMENTS

| | | | |
|---|---|---|---|
| 10,381,371 | B2 | 8/2019 | Ogawa et al. |
| 10,553,603 | B2 | 2/2020 | Yamashita |
| 10,600,805 | B2 | 3/2020 | Park et al. |
| 2016/0027730 | A1 | 1/2016 | Lee |
| 2017/0179151 | A1 | 6/2017 | Kai et al. |
| 2017/0179153 | A1* | 6/2017 | Ogawa ................ H10B 41/41 |
| 2018/0061505 | A1* | 3/2018 | Ghai .................. G11C 16/0483 |
| 2019/0067182 | A1 | 2/2019 | Lee |
| 2019/0355740 | A1 | 11/2019 | Hong et al. |
| 2020/0043830 | A1 | 2/2020 | Baek |
| 2020/0075623 | A1 | 3/2020 | Ito et al. |
| 2021/0210424 | A1* | 7/2021 | Otsu ...................... H10B 43/35 |

FOREIGN PATENT DOCUMENTS

| | | |
|---|---|---|
| JP | 2020-047810 A | 3/2020 |
| JP | 2020-515084 A | 5/2020 |
| KR | 10-2016-0069903 A | 6/2016 |
| KR | 10-2018-0095499 A | 8/2018 |

OTHER PUBLICATIONS

Office Action for Japanese Application No. 2021-101424 dated Mar. 11, 2025.

* cited by examiner

SEMICONDUCTOR DEVICES AND DATA STORAGE SYSTEMS INCLUDING THE SAME

CROSS-REFERENCE TO RELATED APPLICATION(S)

This application claims benefit of priority to Korean Patent Application No. 10-2020-0100043 filed on Aug. 10, 2020 in the Korean Intellectual Property Office, the disclosure of which is incorporated herein by reference in its entirety.

BACKGROUND

Inventive concepts relate to semiconductor devices and/or data storage systems including the same.

In a data storage system requiring data storage, there is increasing demand for a semiconductor device which may store high-capacity data. Accordingly, research into methods of increasing data storage capacity of a semiconductor device has been conducted. For example, a semiconductor device including three-dimensionally arranged memory cells, rather than two-dimensionally arranged memory cells, has been proposed as a method of increasing data storage capacity of a semiconductor device.

SUMMARY

Some example embodiments provide a semiconductor device having improved reliability.

Some example embodiments provide a data storage system including a semiconductor device having improved reliability.

According to some example embodiments, a semiconductor device includes a peripheral circuit structure including a first substrate and active or passive circuits on the first substrate, a memory cell structure including (A) a second substrate on the peripheral circuit structure and having a first region and a second region, (B) gate electrodes stacked on the first region to be spaced apart from each other in a first direction and extending on the second region in a second direction, the gate electrodes in a staircase shape, (C) interlayer insulating layers stacked alternately with the gate electrodes, (D) channel structures penetrating through the gate electrodes, the channel structures extending in the first direction, each of the channel structures including a channel layer, and (E) separation regions penetrating through the gate electrodes, the separation regions extending in the second direction and spaced apart from each other in a third direction, wherein the semiconductor device has a through-wiring region including (A) sacrificial insulating layers parallel to the gate electrodes in the second region and alternately stacked with the interlayer insulating layers, and (B) a through-contact plug electrically connecting the gate electrodes with the active or passive circuits, and a barrier structure surrounding the through-wiring region and having an internal side surface having projections.

According to some example embodiments, a semiconductor device includes a first substrate, active or passive circuits on the first substrate, a second substrate above the active or passive circuits, gate electrodes stacked on the second substrate to be spaced apart from each other in a first direction, channel structures penetrating through the gate electrodes, the channel structures extending in the first direction, each of the channel structures including a channel layer, separation regions penetrating through the gate electrodes and extending in a second direction, a through-contact plug extending through the second substrate in the first direction and electrically connecting the gate electrodes with the active or passive circuits, and a barrier structure spaced apart from the through-contact plug and surrounding the through-contact plug, the barrier structure having first regions each having a first width, and having second regions each having a second width greater than the first width.

According to some example embodiments, a data storage system includes a semiconductor storage device including a first substrate, active or passive circuits on the first substrate, a second substrate above the active or passive circuits, gate electrodes stacked on the second substrate to be spaced apart from each other in a first direction, channel structures penetrating through the gate electrodes and extending in the first direction, each of the channel structures including a channel layer, separation regions penetrating through the gate electrodes and extending in a second direction, a through-contact plug extending through the second substrate in the first direction and electrically connecting the gate electrodes with the active or passive circuits, a barrier structure spaced apart from the through-contact plug and surrounding the through-contact plug, the barrier structure having first regions each having a first width, and second regions each having a second width, greater than the first width, an input/output pad electrically connected to the active or passive circuits, and a controller circuitry electrically connected to the semiconductor storage device through the input/output pad, the controller circuitry configured to control the semiconductor device.

BRIEF DESCRIPTION OF DRAWINGS

The above and other aspects, features, and/or advantages of inventive concepts will be more clearly understood from the following detailed description, taken in conjunction with the accompanying drawings.

FIG. 5 illustrates an enlarged view of region 'A' of FIG. 1A.

DETAILED DESCRIPTION OF SOME EXAMPLE EMBODIMENTS

Hereinafter, some example embodiments will be described with reference to the accompanying drawings.

Figure 1A:
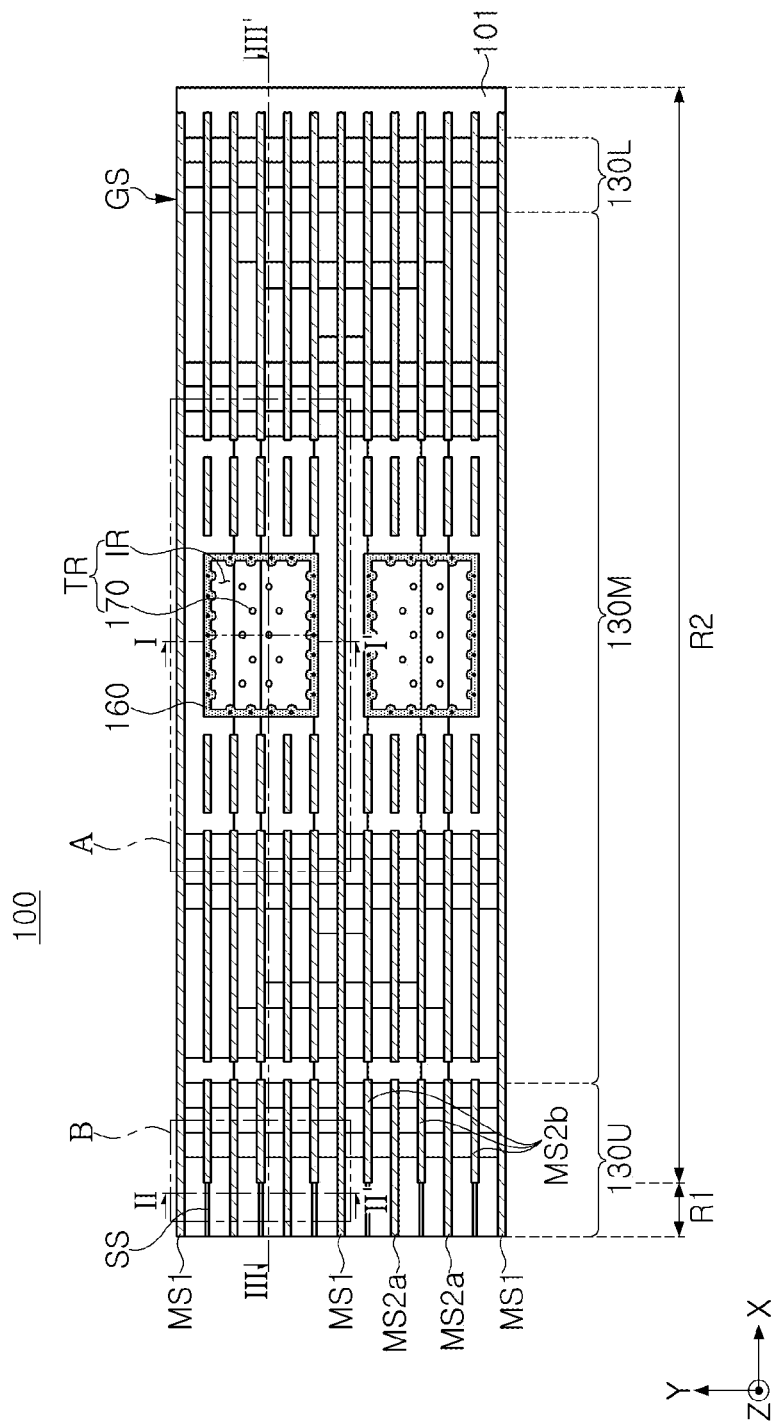
FIGS. 1A to 1C are schematic plan views of a semiconductor device according to some example embodiments.
Figure 1B:
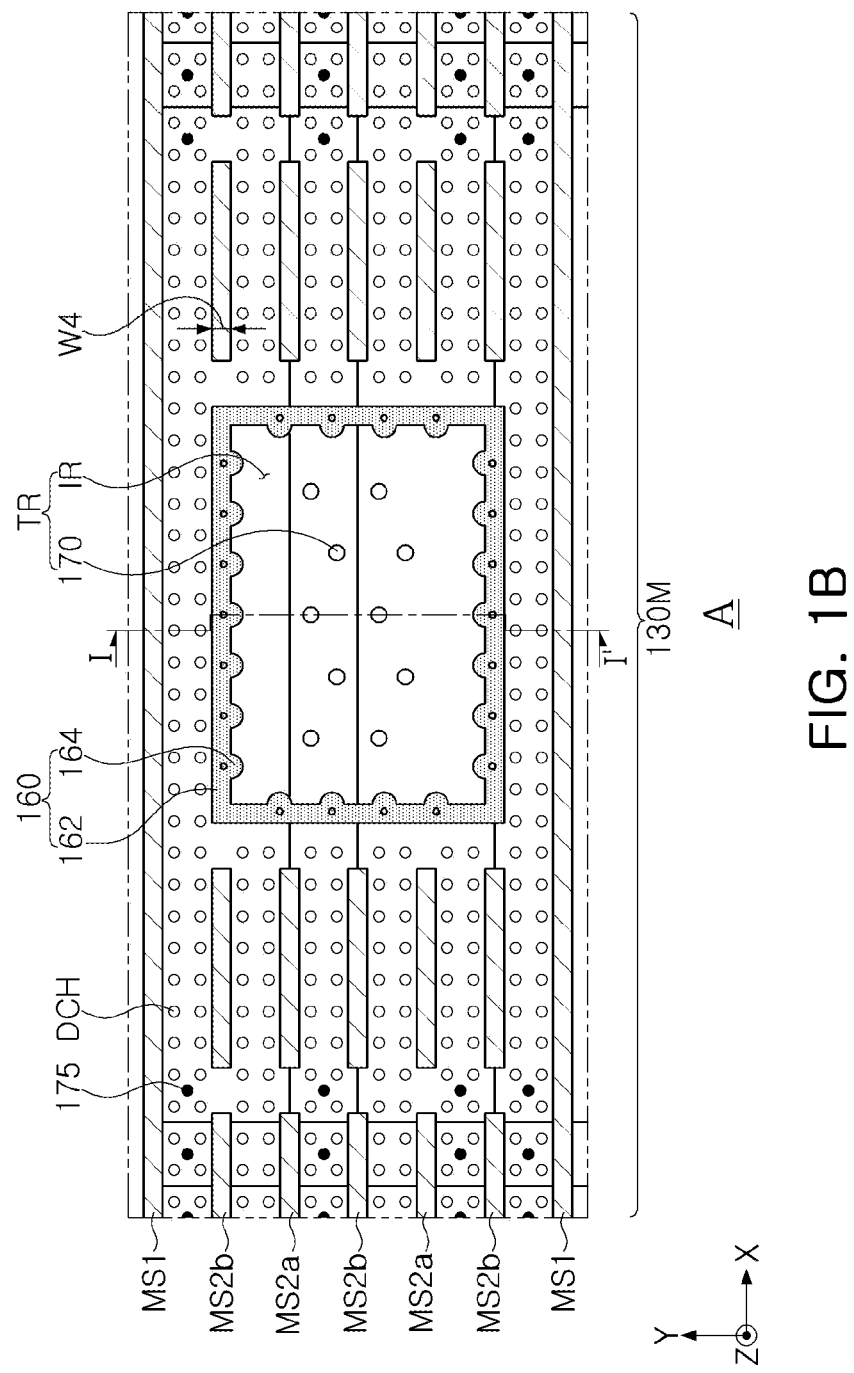
Figure 1C:
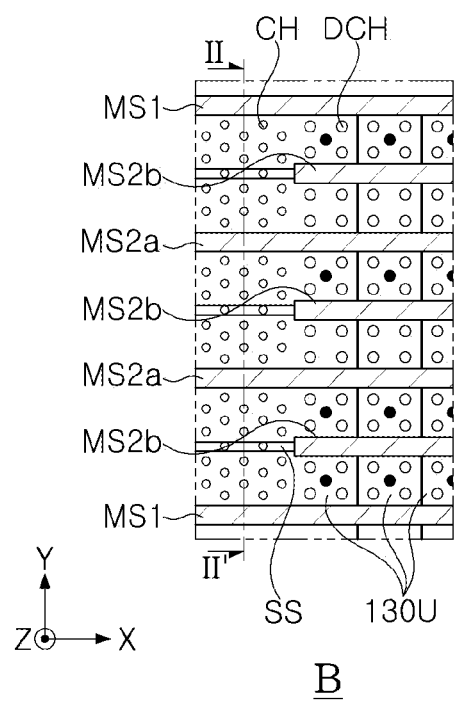

FIGS. 1A to 1C are schematic plan views of a semiconductor device according to some example embodiments. FIG. 1B illustrates an enlarged view of region 'A' of FIG. 1A, and FIG. 1C illustrates an enlarged view of region 'B' of FIG. 1A.

Figure 2A:
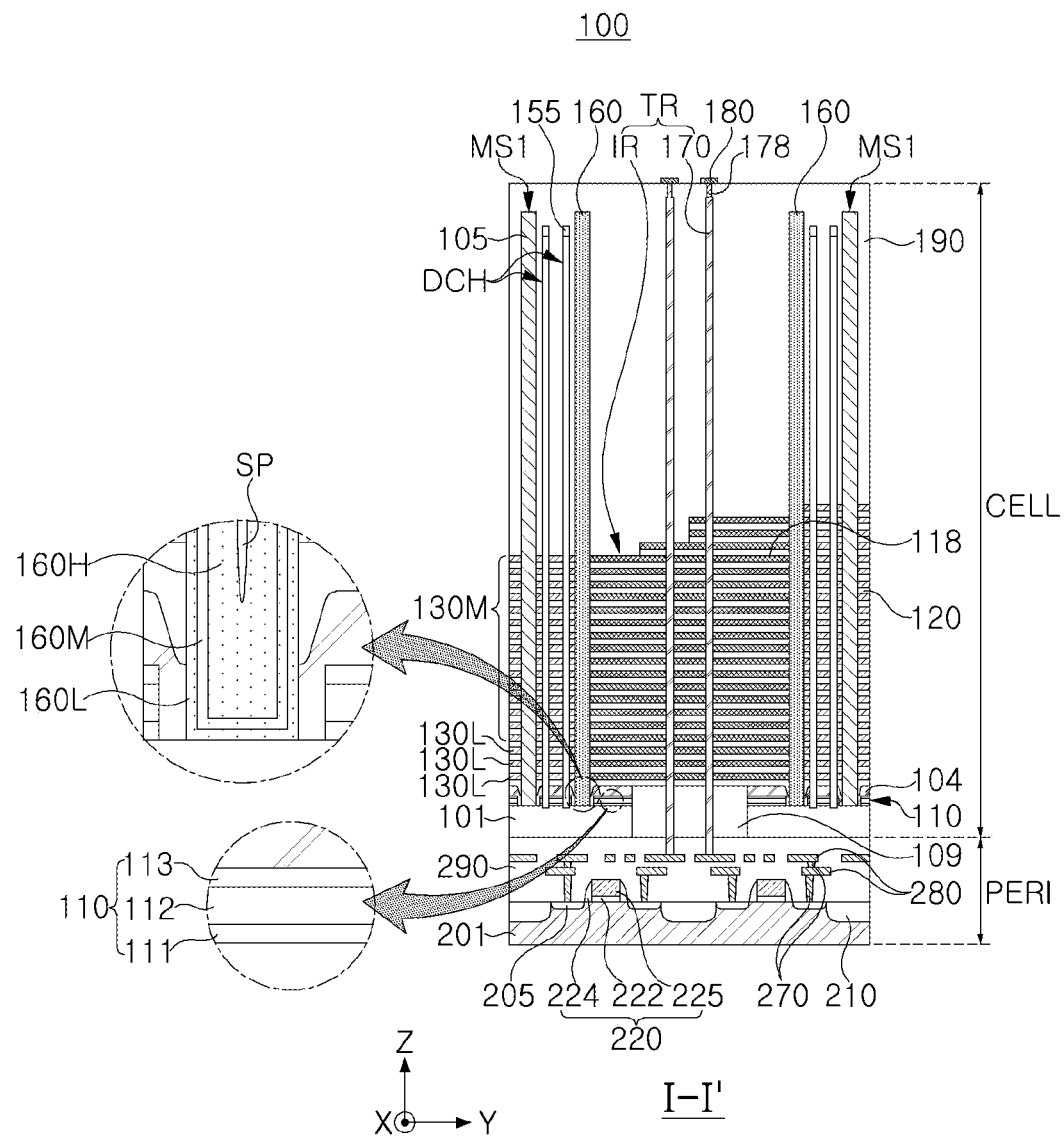
FIGS. 2A to 2C are schematic cross-sectional views of a semiconductor device according to some example embodiments.
Figure 2B:
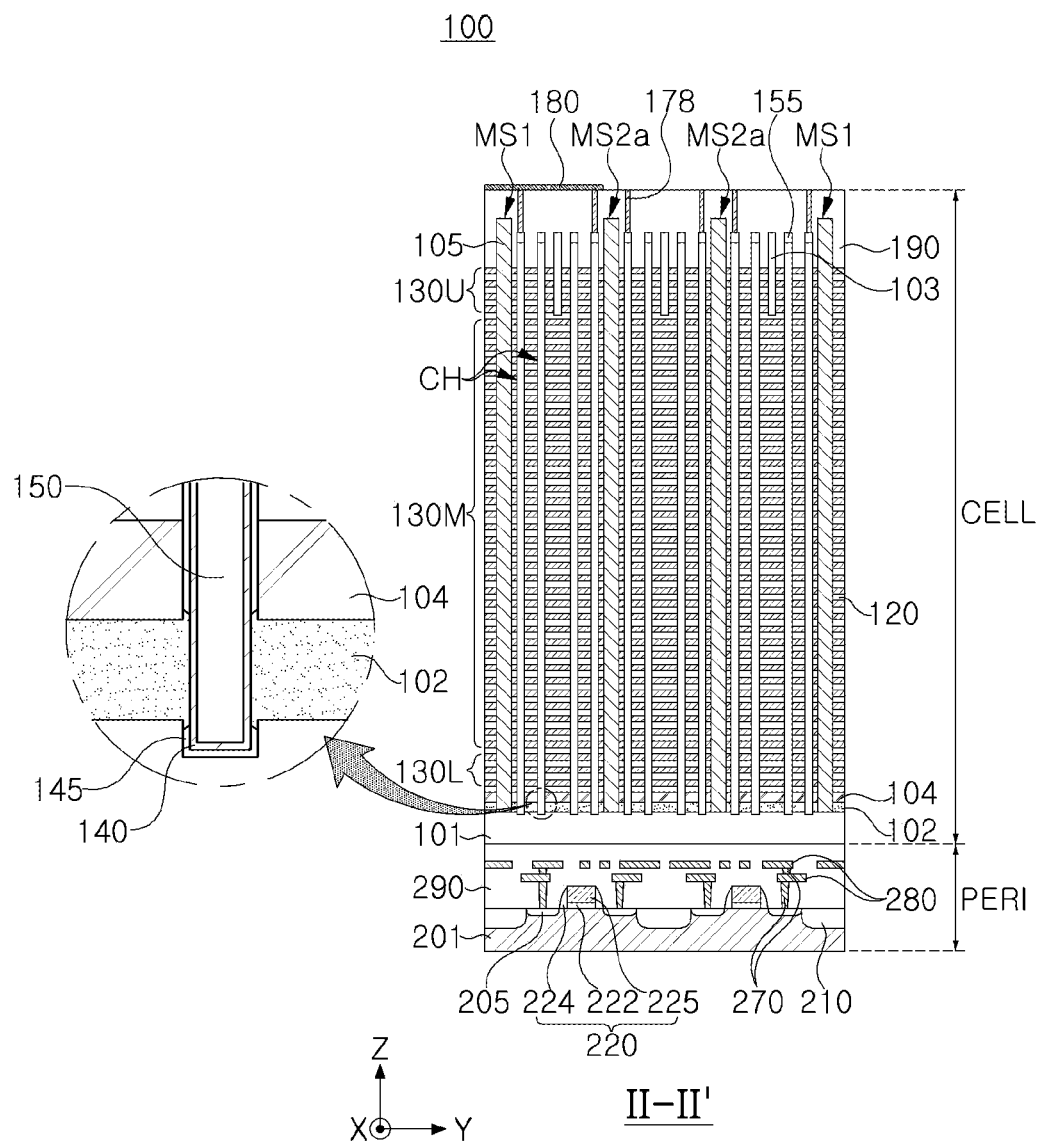
Figure 2C:
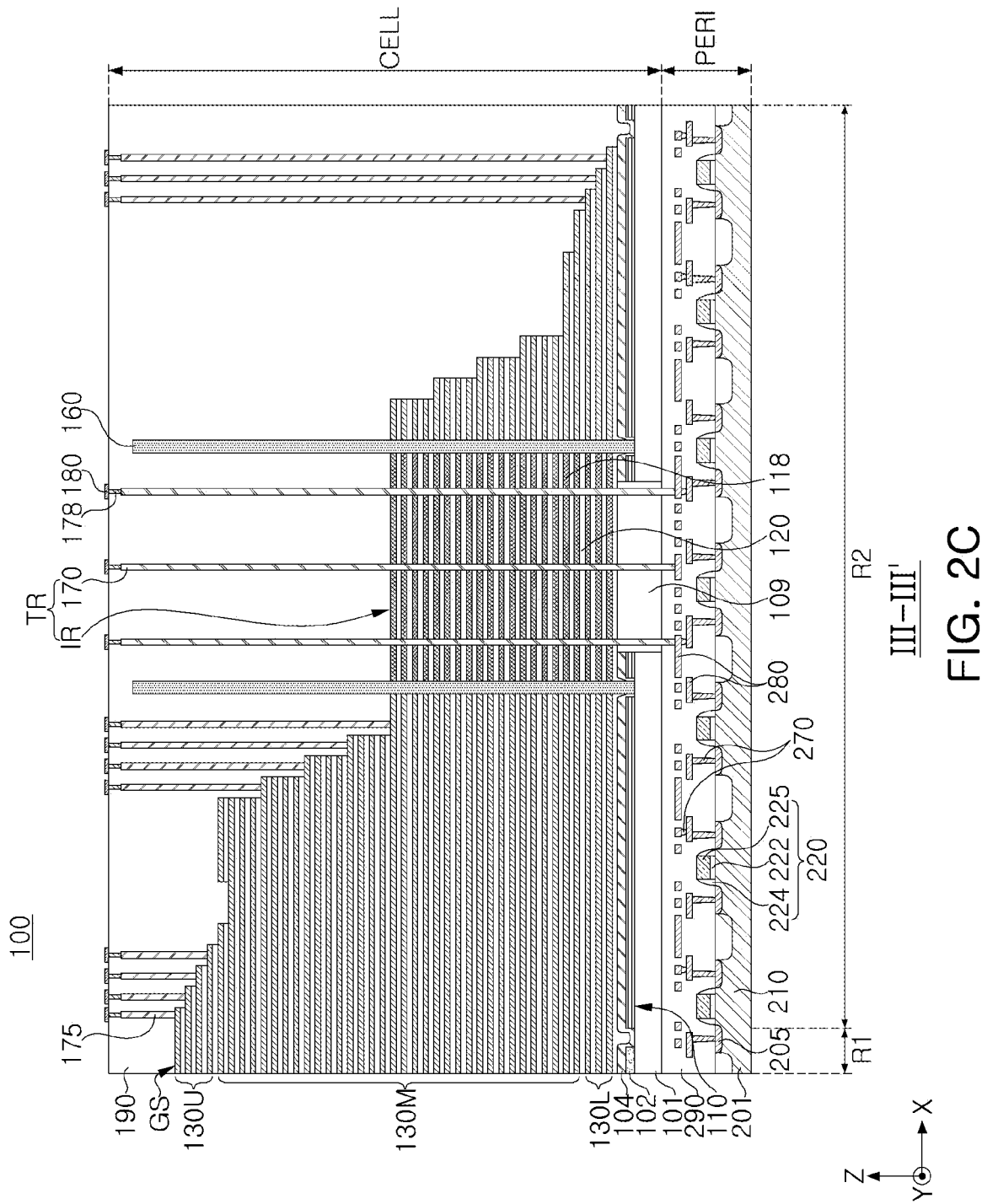

FIGS. 2A to 2C are schematic cross-sectional views of a semiconductor device according to some example embodiments. FIG. 2A is a cross-sectional view taken along line I-I' of FIGS. 1A and 1B, FIG. 2B is a cross-sectional view taken along line II-IT of FIGS. 1A and 1C, and FIG. 2C is a cross-sectional view taken along line III-III' of FIG. 1A.

Figure 3:
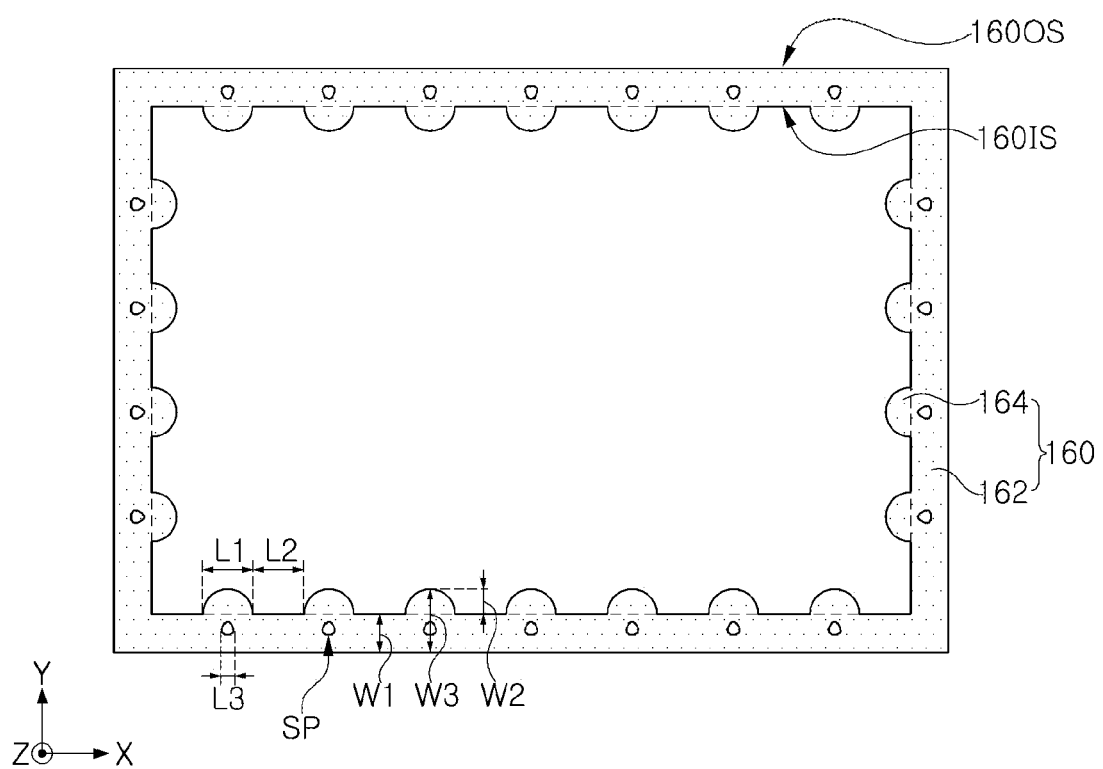
FIG. 3 is an enlarged view of a barrier structure of a semiconductor device according to some example embodiments.

FIG. 3 is an enlarged view of a barrier structure of a semiconductor device according to some example embodiments.

Referring to FIGS. 1A to 2C, a semiconductor device 100 may include a peripheral circuit structure PERI including a first substrate 201, and a memory cell structure CELL including a second substrate 101. The semiconductor device 100 may include a through-wring region TR including a through contact plug 170 electrically connecting the peripheral circuit structure PERI and the memory cell structure CELL to each other. The memory cell structure CELL may be disposed above the peripheral circuit structure PERI, and the through-wiring region TR may be disposed to connect the memory cell structure CELL and the peripheral circuit structure PERI to each other through the memory cell structure CELL. However, example embodiments are not limited thereto; for example, in some example embodiments, the memory cell structure CELL may be disposed below the peripheral circuit structure PERI. In some example embodiments, the memory cell structure CELL and the peripheral circuit structure PERI may be bonded by, for example, copper-to-copper (Cu-to-Cu) bonding.

The peripheral circuit structure PERI may include a first substrate 201, source/drain regions 205 and isolation layers 210 in the first substrate 201, and circuit elements 220, circuit contact plugs 270, circuit wiring lines 280, and a peripheral insulating layer 290 disposed on the first substrate 201.

The first substrate 201 may have an upper surface extending in an X direction and a Y direction. The X direction and the Y direction may be perpendicular with each other; however, example embodiments are not limited thereto. The X direction and the Y direction may be horizontal with respect to the upper surface of the first substrate 201. An active region may be defined in the first substrate 201 by the isolation layers 210. Source/drain regions 205 including impurities such as at least one of boron, phosphorus, arsenic, or carbon may be disposed in a portion of the active region. The first substrate 201 may include a semiconductor material such as at least one of a group IV semiconductor, a group III-V compound semiconductor, or a group II-VI compound semiconductor, and may be a single-crystalline structure. The first substrate 201 may be provided as a bulk wafer and/or an epitaxial layer.

The circuit elements 220 may be or may include active circuits and/or passive circuits. The circuit elements 220 may include an active circuit such as a diode and/or a transistor such as a planar transistor and/or a three-dimensional transistor. Each of the circuit elements 220 may include a circuit gate dielectric layer 222, a spacer layer 224, and a circuit gate electrode 225. Source/drain regions 205 may be disposed in the first substrate 201 on opposite sides adjacent to the circuit gate electrode 225. The circuit elements 220 may be or include passive circuits such as at least one of a resistor, a capacitor, an inductor, or a memristor; however, example embodiments are not limited thereto. The circuit elements 220 may be linear, and/or may be nonlinear, circuit elements. The circuit elements 220 may have one terminal, or two terminals, or three terminals, and/or more than three terminals; however, example embodiments are not limited thereto.

The peripheral insulating layer 290 may be disposed on the circuit element 220 on the first substrate 201. The circuit contact plugs 270 may connected to the source/drain regions 205 through the peripheral insulating layer 290. An electrical signal may be applied to the circuit element 220 by the circuit contact plugs 270. In a region, not illustrated, the circuit contact plugs 270 may also be connected to the circuit gate electrode 225. The circuit wiring lines 280 may be connected to the circuit contact plugs 270 and may be disposed as a plurality of layers, e.g. as a first metal layer with conductive lines extending in the X direction, as a second metal layer with conductive lines extending in the Y direction, and as a third metal layer with conductive lines extending in the X direction. There may be vias (not illustrated) connecting an upper one of the metal layers to a lower one of the metal layers.

The memory cell structure CELL may include a second substrate 101 having a first region R1 and a second region R2, a first horizontal conductive layer 102 on the first region R1 of the second substrate 101, a horizontal insulating layer 110 disposed to be parallel to the first horizontal conductive layer 102 on the second region R2 of the second substrate 101, a second horizontal conductive layer 104 on the first horizontal conductive layer 102 and the horizontal insulating layer 110, gate electrodes 130 stacked on the second horizontal conductive layer 104, first and second separation regions MS1, MS2a, and MS2b extending through a stack structure GS of the gate electrodes 130, a barrier structure 160 disposed to surround a through-wiring region TR in the second region R2, upper separation regions SS penetrating through a portion of the stack structure GS, and channel structures CH disposed to penetrate through the stack structure GS. The memory cell structure CELL may further include interlayer insulating layers 120 alternately stacked with the gate electrodes 130 on the second substrate 101, wiring lines 180, and a cell insulating layer 190.

The first region R1 of the second substrate 101 may be or include a region in which the gate electrodes 130 are vertically stacked and the channel structures CH are disposed, and may be or include a region in which memory cells are disposed. The second region R2 of the second substrate 101 may be or include a region in which the gate electrodes 130 extend by different lengths, and may correspond to a region for electrically connecting the memory cells to the peripheral circuit structure PERI to each other. The second region R2 may be disposed on at least one end of the first region R1 in at least one direction, for example, in the X direction.

The second substrate 101 may have an upper surface extending in the X direction and the Y direction. The second substrate 101 may include a semiconductor material such as a group IV semiconductor, a group III-V compound semiconductor, or a group II-VI compound semiconductor. For example, the group IV semiconductor may include silicon, germanium, or silicon-germanium. The second substrate 101 may further include impurities such as t least one of boron, arsenic, phosphorus, or carbon. The second substrate 101 may be provided as a heterogeneous or homogenous epitaxial layer or a polycrystalline semiconductor layer such as a polysilicon layer. The second substrate 101 may include the same, or different, semiconductor materials as the first semiconductor substrate 201.

The first and second horizontal conductive layers 102 and 104 may be sequentially stacked to be disposed on the upper surface of the first region R1 of the second substrate 101. The first horizontal conductive layer 102 may not extend to the second region R2 of the second substrate 101, and the second horizontal conductive layer 104 may extend to the second region R2.

The first horizontal conductive layer 102 may serve as or correspond to a portion of a common source line of the semiconductor device 100. For example, the horizontal conductive layer 102 may serve as or correspond to a common source line together with the second substrate 101. As illustrated in the enlarged view of FIG. 2B, the first horizontal conductive layer 102 may be connected, e.g. may be directly connected to the channel layer 140 on a periphery of the channel layer 140.

The second horizontal conductive layer 104 may be in contact with the second substrate 101 in some regions in which the first horizontal conductive layer 102 and the horizontal insulating layer 110 are not disposed. The second horizontal conductive layer 104 may be bent, e.g. may be conformal, while covering an end portion of the first horizontal conductive layer 102 or the horizontal insulating layer 110 in the regions, to extend onto the second substrate 101.

The first and second horizontal conductive layers 102 and 104 may include a semiconductor material. For example, both the first and second horizontal conductive layers 102 and 104 may include doped polysilicon. In this case, at least the first horizontal conductive layer 102 may be or include a doped layer, or the second horizontal conductive layer 104 may be or include a doped layer or a layer containing impurities diffused from the first horizontal conductive layer 102. However, in some example embodiments, some or all of the second horizontal conductive layer 104 may be replaced with an insulating layer.

The horizontal insulating layer 110 may be disposed to be parallel to the first horizontal conductive layer 102 on the second substrate 101 in at least a portion of the second region R2. The horizontal insulating layer 110 may include first to third horizontal insulating layers 111, 112, and 113 sequentially stacked on the second region R2 of the second substrate 101, as illustrated in the enlarged view of FIG. 2A. The horizontal insulating layer 110 may be or include a layer remaining after a portion of the horizontal insulating layer 110 is replaced with the first horizontal conductive layer 102 in a manufacturing/fabrication process of the semiconductor device 100.

The horizontal insulating layer 110 may include at least one of silicon oxide, silicon nitride, silicon carbide, or silicon oxynitride. The first and third horizontal insulating layers 111 and 113 and the second horizontal insulating layer 112 may include, e.g. may consist of, different insulating materials. The first and third horizontal insulating layers 111 and 113 may include, e.g. may consist of, the same material. For example, the first and third horizontal insulating layers 111 and 113 may be formed of the same material as the interlayer insulating layers 120, and the second horizontal insulating layer 112 may be formed of the material as sacrificial insulating layers 118.

The gate electrodes 130 may be vertically spaced apart from each other to be stacked on the second substrate 101 to constitute or be included in a stack structure GS. The gate electrodes 130 may include a lower gate electrode 130L constituting or corresponding to a gate of a ground select transistor, memory gate electrodes 130M constituting or corresponding to a plurality of memory cells, and upper gate electrodes 130U constituting or corresponding to gates of the string select transistors. The number of memory gate electrodes 130M, constituting or corresponding to the plurality of memory cells, may be determined depending on capacity of the semiconductor device 100. According to some example embodiments, one to four or more upper and lower gate electrodes 130U and 130L may be respectively provided, and the upper and lower gate electrodes 130U and 130L may have the same structure as the memory gate electrodes 130M or may have a structure different from a structure of the memory gate electrodes 130M. In some example embodiments, the gate electrodes 130 may further include a gate electrode 130 disposed above the upper gate electrodes 130U and/or below the lower gate electrode 130L and constituting an erase transistor used in an erase operation using gate induced drain lowering (GIDL) phenomenon. Some of the gate electrodes 130, for example, the memory gate electrodes 130M, adjacent to the upper gate electrode 130U or the lower gate electrode 130L, may be dummy gate electrodes.

The gate electrodes 130 may be vertically stacked and spaced apart from each other on the first region R1, and may extend from the first region R1 to the second region R2 by different lengths to form a stair-case structure or a step structure. As illustrated in FIG. 2C, the gate electrodes 130 may form a step structure between the gate electrodes 130 in the X direction. In some example embodiments, among at least some of the gate electrodes 130, a certain number of gate electrodes 130, for example, two to six gate electrodes 130 may constitute or correspond to a single gate group to form a step structure between the gate groups in the X direction. In this case, the gate electrodes 130, constituting/corresponding to a single gate group, may be disposed to have a step structure in the Y direction. Due to the step structure, the gate electrodes 130 may provide end portions having a step shape, in which the lower gate electrode 130 extends longer than the upper gate electrode 130, and exposed upwardly of the interlayer insulating layers 120. In some example embodiments, the gate electrodes 130 may have an increased thickness on the end portions.

As illustrated in FIG. 1A, the gate electrodes 130 may be disposed to be separated from each other in the Y direction by a first separation region MS1 extending in the X direction. The gate electrodes 130 between a pair of first separation regions MS1 may constitute or correspond to a single memory block, but the range of the memory block is not limited thereto. Some of the gate electrodes 130, for example, the memory gate electrodes 130M, may constitute or correspond to a single layer within a single memory block.

The gate electrodes 130 may include a metallic material, for example, tungsten (W). According to some example embodiments, the gate electrodes 130 may include doped or undoped polysilicon or a metal silicide material. In some example embodiments, the gate electrodes 130 may further include a diffusion barrier. For example, the diffusion barrier may include tungsten nitride (WN), tantalum nitride (TaN), and titanium nitride (TiN), or combinations thereof.

The interlayer insulating layers 120 may be disposed between the gate electrodes 130. Similarly to the gate electrodes 130, the interlayer insulating layers 120 may be spaced apart from each other in a direction, perpendicular to an upper surface of the second substrate 101, and may be disposed to extend in the X direction. The interlayer insulating layers 120 may include an insulating material such as silicon oxide and/or silicon nitride.

The first and second separation regions MS1, MS2*a*, and MS2*b* may extend in the X direction through the gate electrodes 130. The first and second separation regions MS1, MS2*a*, and MS2*b* may be disposed to be parallel to each other, e.g. parallel in the X direction. The first and second separation regions MS1, MS2*a*, and MS2*b* may be connected to the second substrate 101 through some or the entire gate electrodes 130 stacked on the second substrate 101. The first separation regions MS1 may extend as a single separation region in the X direction, and the second separation regions MS2*a* and MS2*b* may intermittently extend and/or may be disposed in only a certain region between the pair of first separation regions MS1. For example, the second middle separation regions MS2*a* may extend as a single separation region in the first region R1 and may intermittently extend in the second region R2 in the X direction. The second auxiliary separation regions MS2*b* may be disposed in only the second region R2 and may intermittently extend in the X direction. However, in some example embodiments, the disposition order and/or the number of the first and second separation regions MS1, MS2*a*, and MS2*b* are not limited to what is illustrated in FIG. 1A. The first and second separation regions MS1, MS2*a*, and MS2*b* are not disposed to overlap the through-wiring region TR, and may be disposed to be spaced apart from the through-wiring region TR.

As illustrated in FIGS. 2A and 2B, a separation insulating layer 105 may be disposed in each of the first and second separation regions MS1, MS2*a*, and MS2*b*. The separation insulating layer 105 may have a tapered shape, e.g. may have shape in which a width is decreased in a direction toward the second substrate 101 due to a high aspect ratio, but the shape of the separation insulating layer 105 is not limited thereto. The separation insulating layer 105 may have a side surface, perpendicular to the upper surface of the second substrate 101. In some example embodiments, a conductive layer may be further disposed in the separation insulating layer 105 in each of the first and second separation regions MS1, MS2*a*, and MS2*b*. In this case, the conductive layer may serve as or correspond to a common source line of the semiconductor device 100 or a contact plug connected to the common source line.

As illustrated in FIG. 1A, in the first region R1, upper separation regions SS may extend in the X direction between the first separation regions MS1 and the second middle separation region MS2*a* and between the second middle separation regions MS2*a*. The upper separation regions SS may be disposed to penetrate through a portion of the gate electrodes 130 including an uppermost upper gate electrode 130U, among the gate electrodes 130. As illustrated in FIG. 2B, the upper separation regions SS may separate a total of four gate electrodes 130, including the upper gate electrodes 130U, from each other in the Y direction. However, the number of the gate electrodes 130, separated by the upper separation regions SS, may vary in some example embodiments. The upper gate electrodes 130U, separated by the upper separation regions SS, may constitute or correspond to different string select lines. An upper insulating layer 103 may be disposed in the upper separation regions SS. The upper insulating layer 103 may include an insulating material. The upper insulating layer 103 may include, for example, at least one of silicon oxide, silicon nitride, or silicon oxynitride.

As illustrated in FIG. 1C, the channel structures CH may each constitute or correspond to a single memory cell string, and may be disposed to be spaced apart from each other while constituting or correspond to rows and columns on the first region R1. The channel structures CH may be disposed to form a grid pattern, e.g. a rectangular or square grid pattern, and/or may be disposed in zigzag form in one direction. The channel structures CH have a columnar shape, and may have a tapered profile, e.g. an inclined side surface narrowed in a direction toward the second substrate 101 depending on an aspect ratio.

As illustrated in the enlarged view of FIG. 2B, the channel layer 140 may be disposed in the channel structures CH. In the channel structures CH, the channel layer 140 may be formed to have an annular shape surrounding the channel buried insulating layer 150. However, according to some example embodiments, the channel layer 140 may have a columnar shape such as a cylindrical shape or a prismatic shape without the channel buried insulating layer 150. The channel layer 140 may be connected to the first horizontal conductive layer 102 below the channel layer 140. The channel layer 140 may include a semiconductor material such as doped or undoped polycrystalline silicon and/or single-crystalline silicon.

The channel pads 155 may be disposed on the channel layer 140 in the channel structures CH. The channel pads 155 may be disposed to cover an upper surface of the channel buried insulating layer 150 and to be electrically connected to the channel layer 140. The channel pads 155 may include, for example, doped polysilicon.

The gate dielectric layer 145 may be disposed between the gate electrodes 130 and the channel layer 140. Although not illustrated in detail, the gate dielectric layer 145 may include a tunneling layer, a charge storage layer, and a blocking layer that are sequentially stacked from the channel layer 140. The tunneling layer may tunnel charges to the charge storage layer and may include, for example, silicon oxide ($SiO_2$), silicon nitride ($Si_3N_4$), silicon oxynitride (SiON), or combinations thereof. The charge storage layer may be a charge trapping layer and/or a floating gate conductive layer. The blocking layer may include silicon oxide ($SiO_2$), silicon nitride ($Si_3N_4$), silicon oxynitride (SiON), a high-k dielectric material, or combinations thereof. In some example embodiments, at least a portion of the gate dielectric layer 145 may extend along the gate electrodes 130 in a horizontal direction.

Dummy channel structures DCH may have the same structure as the channel structures CH and/or may have a structure different from a structure of the channel structures CH, and may be disposed to be spaced apart from each other while constituting rows and columns in a portion of the first region R1 and the second region R2. The dummy channel structures DCH may not be electrically connected to wiring structures disposed above the dummy channel structures DCH, and/or may not constitute a memory cell string in the semiconductor device 100, unlike the channel structures CH. In the first region R1, the dummy channel structures DCH may be disposed in a region adjacent to the second region R2.

As illustrated in FIG. 2A, the dummy channel structures DCH in the second region R2 may be disposed to penetrate through the horizontal insulating layer 110 in a Z direction. Each of the dummy channel structures DCH may have a lower portion that is surrounded by the second horizontal conductive layer 104 and the horizontal insulating layer 110, and may be spaced apart from the first horizontal conductive layer 102. Specifically, the dummy channel structures DCH may penetrate through the interlayer insulating layers 120 and the gate electrodes 130 and may penetrate through the second horizontal conductive layer 104 and the horizontal insulating layer 110 on a lower end thereof. In some example embodiments, in the through-wiring region TR the dummy channel structures DCH may be further disposed to penetrate through the interlayer insulating layers 120 and the sacrificial insulating layers 118, and to penetrate through the second horizontal conductive layer 104 and the horizontal insulating layer 110.

The through-wiring region TR may include a wiring structure for electrically connecting the memory cell structure CELL and the peripheral circuit structure PERI to each other. In particular, the through-wiring region TR may be disposed to penetrate through the second region R2. The through-wiring region TR may include through-contact plugs 170, extending in the Z direction through the second substrate 101, and an insulating region IR surrounding the through-contact plugs 170. As described herein, a region within the barrier structure 160 will be referred to as a through-wiring region TR in the second region R2. For example, one through-wiring region TR may be disposed for one memory block, and may be further disposed in the first region R1. However, the number and/or the size and/or the disposition form and/or the shape, and the like of the through-wiring regions TR may vary according to some example embodiments. For example, in some example embodiments, one through-wiring region TR may be disposed for each of a plurality of memory blocks.

The through-wiring region TR may be disposed to be spaced apart from the first and second separation regions MS1, MS2a, and MS2b, as illustrated in FIGS. 1A and 1B. For example, the through-wiring region TR may be spaced apart from the first separation regions MS1, adjacent to each other in the Y direction, to be disposed in a center of the pair of first separation regions MS1. Such a disposition may allow the sacrificial insulating layers 118 to remain in the through-wiring region TR.

The insulating region IR may penetrate through the memory cell structure CELL to be disposed parallel to the substrate 101 and the gate electrodes 130. The insulating region IR, in which the gate electrode 130 does not extend or is not disposed, may include an insulating stack structure formed of or including an insulating material. The insulating region IR may include a substrate insulating layer 109, a first insulating layer disposed on the same level as the second substrate 101 to be parallel to the second substrate 101, and interlayer insulating layers 120 and the sacrificial insulating layers 118, second and third insulating layers alternately disposed on an upper surface of the second substrate 101.

The substrate insulating layer 109, may be disposed in a region, in which a portion of the second substrate 101, the horizontal insulating layer 110, and the second horizontal conductive layer 104 is removed, to be surrounded by the substrate 101, the horizontal insulating layer 110, and the second horizontal conductive layer 104. A lower surface of the substrate insulating layer 109 may be coplanar with a lower surface of the second substrate 101, or at least some portions or all of the lower surface of the substrata insulating layer 109 may be disposed on a lower level than the lower surface of the second substrate 101. In some example embodiments, the substrate insulating layer 109 may include a plurality of insulating layers. Since the second insulating layer is formed by extending the interlayer insulating layers 120, the second insulating layer may be disposed on substantially the same level as the interlayer insulating layers 120. The third insulating layer may include sacrificial insulating layers 118 and may be disposed on substantially the same level as the gate electrodes 130.

The substrate insulating layer 109, the interlayer insulating layers 120, and the sacrificial insulating layers 118, constituting or include in the insulating region IR, may be formed of or include an insulating material. For example, each of the substrate insulating layer 109, the interlayer insulating layers 120, and the sacrificial insulating layers 118 may include at least one of silicon oxide, silicon nitride, or silicon oxynitride. The substrate insulating layer 109 and the sacrificial insulating layers 118 may have different widths, or may have the same width according to some example embodiments.

The through-contact plugs 170 may vertically penetrate through the entire insulating region IR to extend in a direction, perpendicular to the upper surface of the second substrate 101, and may electrically connect the memory cell structure CELL and the circuit elements 220 (e.g. the active or passive circuits) of the peripheral circuit structure PERI to each other. For example, the through-contact plugs 170 may connect the gate electrodes 130 and/or the channel structures CH of the memory cell structure CELL to the circuit elements 220 of the peripheral circuit structure PERI. The through-contact plugs 170 may be connected to upper plugs 178 and wiring lines 180, in a portion above the through-contact plugs 170. The through-contact plugs 170 may be connected to circuit wiring lines 280, in a portion below the through-contact plugs 170.

The through-contact plugs 170 may penetrate through the interlayer insulating layers 120 and the sacrificial insulating layers 118 in the insulating region IR, and may penetrate through the substrate insulating layer 109 in a portion below the substrate insulating layer 109. Any or all of the number, form, and shape of the through-contact plugs 170 in a single through-wiring region TR may vary in example embodiments. According to some example embodiments, the through-contact plugs 170 may have a form in which a plurality of layers is connected. According to some example embodiments, other than the through-contact plugs 170, wiring structures having a wiring line form may be further provided in the insulating region IR. The through-contact plugs 170 may include a conductive material, and may include, for example, at least one of tungsten (W), copper (Cu), aluminum (Al), doped silicon such as doped polysilicon, or the like.

The barrier structure 160 may be disposed to surround the through wiring area TR in the second region R2. The barrier structure 160 may include horizontal regions such as first horizontal regions disposed collinearly, e.g. on a straight line with some of the first and second separation regions MS1, MS2a, and MS2b extending in the X direction, and second horizontal regions, or vertical regions extending in the Y direction, when viewed from above. In some example embodiments, the horizontal regions and the vertical regions may form a single closed curve, e.g. may form a single closed curve when viewed in a plan view.

As illustrated in FIG. 3, the barrier structure 160 may have first and second barrier regions having different widths in an extension direction. The first and second barrier regions may be alternately disposed in at least some regions. The barrier structure 160 may include a ring-shaped and/or rectangular, e.g. square, extension portion 162, extending in the X direction and the Y direction with a first width W1, a substantially constant width, and projections 164 protruding from the extension portion 162 on an internal side surface 160IS. For example, the second barrier region may be a region in which the projections 164 are disposed. The first width W1 may be the same, or different, between portions of the barrier structure 160 extending in the X direction and portions of the barrier structure 160 extending in the Y direction.

The projections 164 may protrude in a direction, perpendicular to the extension direction of the extension portion 162. Specifically, the projections 164 may protrude from the horizontal regions in the Y direction and may protrude from the vertical regions in the X direction. The projections 164 may have a semicircular shape or a semicircle-like shape. An internal surface 160IS of the barrier structure 160 may have a curvature formed by the projections 164, and an external surface 160OS of the barrier structure 160 may be substantially flat, e.g. substantially linear. The flatness of the external surface 160OS may allow a space, in which dummy channel structures DCH are disposed outside the barrier structure 160, to be secured.

The projections 164 may be disposed to be spaced apart from each other at regular intervals on the extension portion 162. A pitch between adjacent ones of the projections 164 may be constant. In some example embodiments, a length L1 of each of the projections 164 and an interval L2 between the projections 164 in the extension direction of the extension portion 162 may be variously changed. For example, a ratio of the length L1 to the interval L2 (L1/L2) may range from about 0.3 to about 2.0. When the ratio L1/L2 is smaller or greater than the above range, an effect achieved by the projections 164 to be described below may be insignificant. The extension portion 162 may have a first width W1 in a direction, perpendicular to the extension direction, and each of the projections 164 may have a second width W2, e.g. a maximum width, e.g. a radius of a semicircle. Accordingly, the barrier structure 160 may have a third width W3, e.g. a maximum width. The first width W1 may be substantially the same as a width W4 of each of the first and second separation regions MS1, MS2a, and MS2b. For example, the third width W3 may range from about 1.3 times to about 2.5 times the first width W1. When the third width W3 is greater than the above range, for example, when the second width W2 is relatively great, difficulty in process e.g. in fabrication process, may be increased. When the third width W3 is less than the above range, the effect achieved by the projections 164 may be insignificant. In particular, the third width W3 may range from about 1.3 times to about 2 times the first width W1, for example, the second width W2 may be smaller than the first width W1. For example, the third width W3 may range from about 180 nm to about 300 nm.

The barrier structure 160 may have seams SP formed therein. The seams SP may be disposed within the extension portion 162 adjacent to the projections 164, and may be spaced apart from each other to correspond to each of the projections 164. The seams SP may be formed in a position shifted to the projections 164 from a center of the extension portion 162 in a direction, perpendicular to an extension direction. Each of the seams SP may have a tapered shape, e.g. a shape in which a width is decreased in a direction toward the projections 164, but the shape of each of the seams SP is not limited thereto. The maximum length L3 of each of the seams SP may be smaller than the length L1 of each of the projections 164, and may vary according to some example embodiments.

As illustrated in FIGS. 2A and 2C, the barrier structure 160 may be disposed on a boundary between the gate electrodes 130 and the sacrificial insulating layers 118. An external surface of the barrier structure 160 may be in contact with the gate electrodes 130, and an internal surface of the barrier structure 160 may be in contact with the sacrificial insulating layers 118. The barrier structure 160 may be disposed on substantially the same level as the first and second separation regions MS1, MS2a, and MS2b. For example, the barrier structure 160 may be formed in a trench formed in the same process as the first and second separation regions MS1, MS2a, and MS2b. Similarly to the disposition of the first and second separation regions MS1, MS2a, and MS2b in the second region R2, the barrier structure 160 may be disposed in a region in which the second horizontal conductive layer 104 is in direct contact with the second substrate 101. Accordingly, the barrier structure 160 may penetrate through the second horizontal conductive layer 104 on a lower end thereof, and may be in contact with the horizontal conductive layer 104 and may be spaced apart from the first horizontal conductive layer 102 and the horizontal insulating layer 110.

As illustrated in the enlarged view of FIG. 2A, the barrier structure 160 may include first to third barrier layers 160L, 160M, and 160H sequentially stacked along side surfaces and a bottom surface. The first to third barrier layers 160L, 160M, and 160H may include, e.g. may consist of, different materials. The seams SP may be formed in the third barrier layer 160H having a relatively large thickness. For example, each of the first and second barrier layers 160L and 160M may include one of silicon oxide, silicon nitride, and silicon oxynitride, and the third barrier layer 160H may include polysilicon. However, an internal structure of the barrier structure 160 may vary according to some example embodiments.

The barrier structure 160 may be included in semiconductor device 100 to prevent or reduce the likelihood of a material used in forming the gate electrodes 130 from flowing or diffusing into the through-wiring region TR and to control a region in which the gate electrodes 130 extend. However, since materials of the stack structure with which the external side surface (e.g. the outer side surface) and the internal side surface (e.g. the inner side surface) are in contact are different from each other, stresses on the internal side surface and the external side surface are different from each other, and thus, the barrier structure 160 may have a physically vulnerable structure. Accordingly, when the seam is formed in an extension direction of the barrier structure 160, a defect such as cracking may occur in the barrier structure 160. However, since the barrier structure 162 includes projections 164, deposition may be continuously performed in a region having the relatively great width W3. Thus, seams SP may be locally formed and may be disposed to be spaced apart from each other without being connected to each other. As a result, the physical vulnerability of the barrier structure 160 may be reduced. Alternatively or additionally, the shape, size, and the like of each of the projections 164 may be adjusted to control a size and a position of each of the seams SP.

As illustrated in FIG. 2C, in the second region R2, the gate contact plugs 175 may be connected to gate electrodes 130, each having an upwardly exposed upper surface, among the gate electrodes 130.

The upper plugs 178 and the wiring lines 180 may constitute or be included in an upper wiring structure electrically connected to memory cells in the memory cell structure CELL. For example, the wiring lines 180 may be electrically connected to the through-contact plugs 170, the gate electrodes 130, and the channel structures CH. The number of contact plugs and/or wiring lines constituting or included in the wiring structure may vary according to some example embodiments. Each of the upper plugs 178 and the wiring lines 180 may include a metal. For example, each of the upper plugs 178 and the wiring lines 180 may include at least one of tungsten (W), copper (Cu), aluminum (Al), or the like.

The cell insulating layer 190 may be disposed to cover the second substrate 101, the gate electrodes 130 on the second substrate 101, and the peripheral insulating layer 290. The cell insulating layer 190 may be formed of an insulating material, and may include a plurality of insulating layers.

Figure 4A:
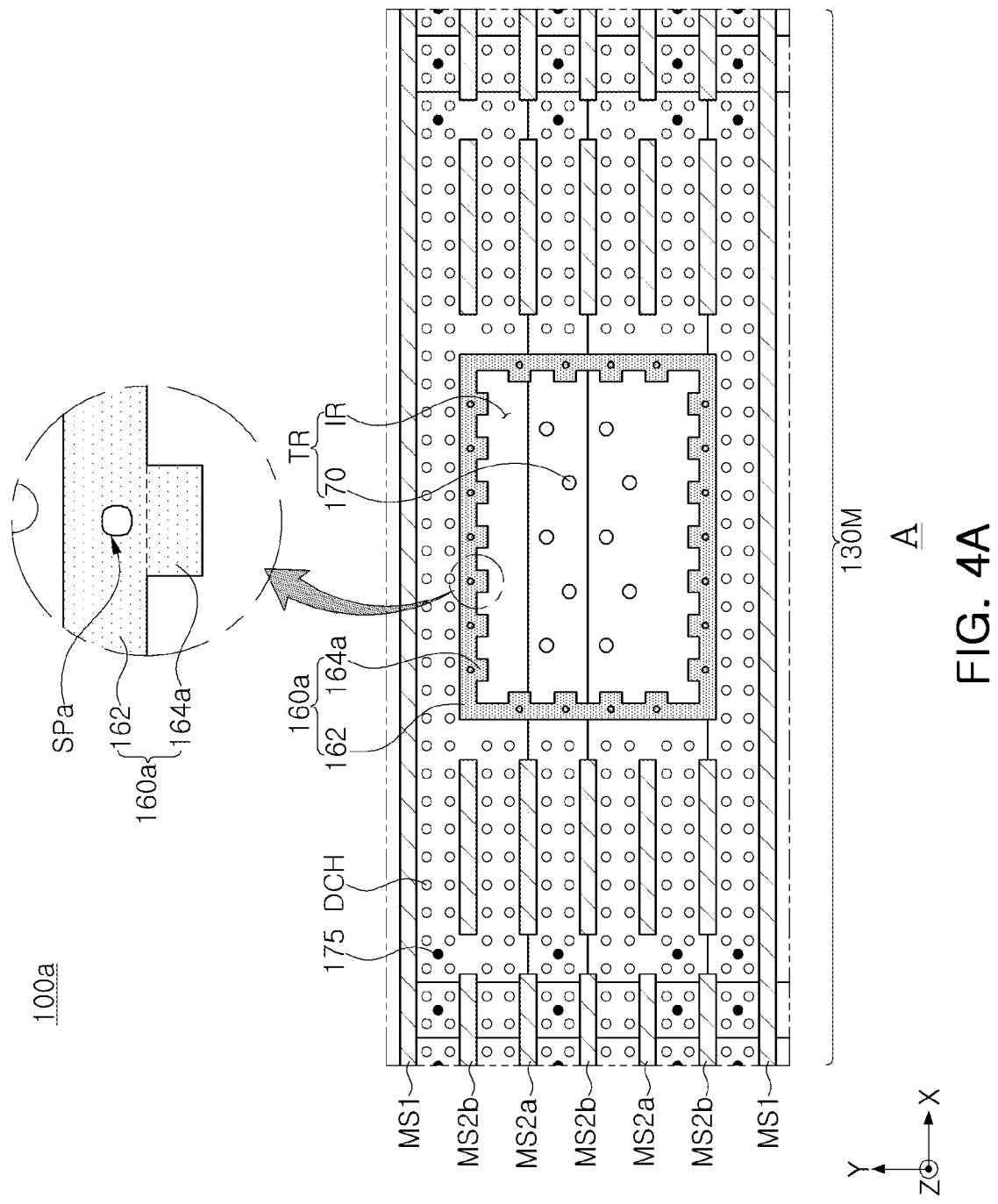
FIGS. 4A and 4B are plan views of a semiconductor device according to some example embodiments.
Figure 4B:
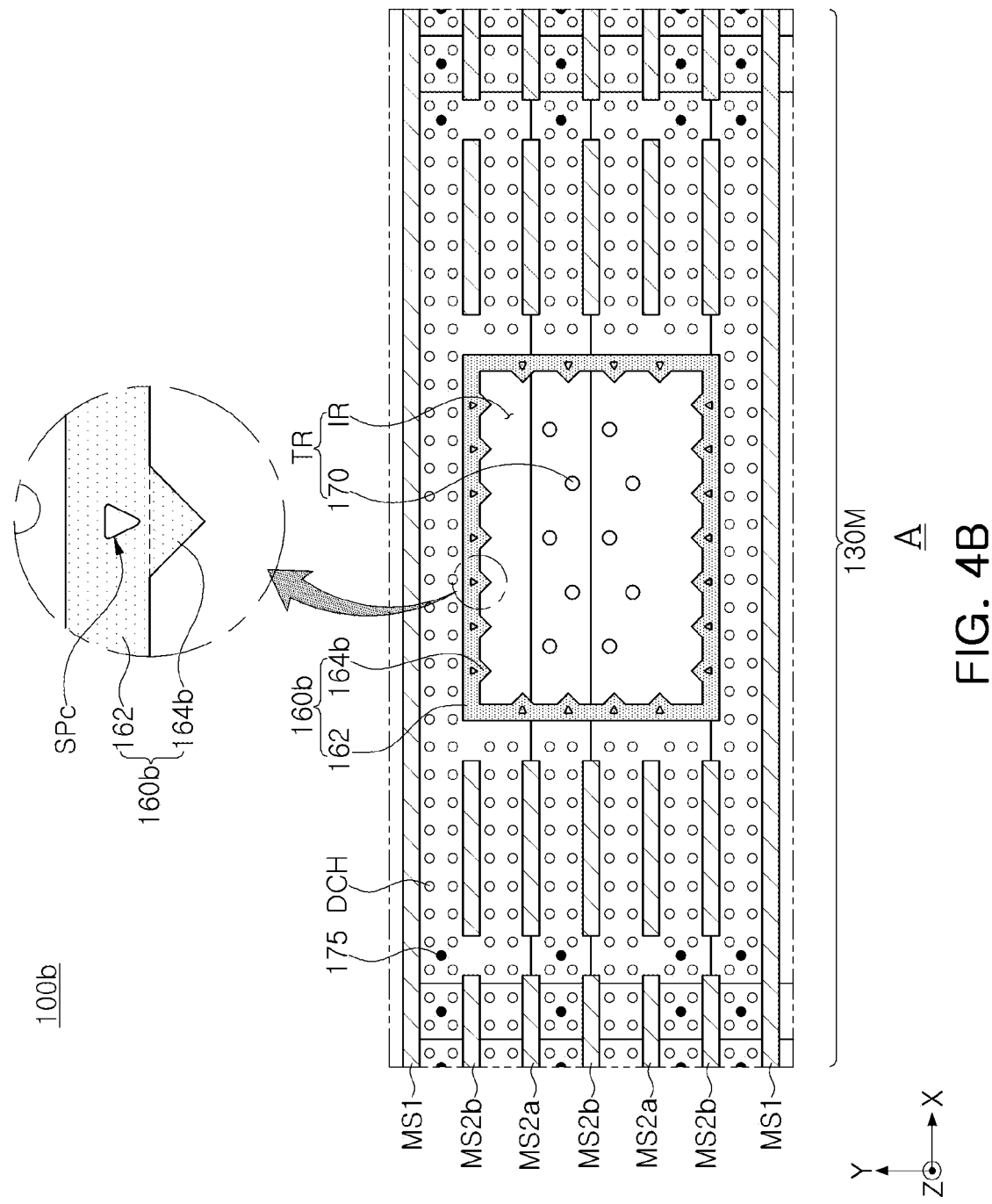

FIGS. 4A and 4B are plan views of a semiconductor device according to some example embodiments. FIGS. 4A and 4B illustrate an enlarged view of region corresponding to region 'A' of FIG. 1A.

Referring to FIG. 4A, in a semiconductor device 100a, projections 164a of a barrier structure 160a may have a rectangular shape or a rectangle-like shape such as a square shape. Specifically, the projections 164a may have a region having a constant width in a direction, perpendicular to an extension direction of an extension portion 162. However, in some example embodiments, a corner of each of the projections 164a may have a rounded shape or beveled shape or chamfered shape due to process factors such as photolithographic factors.

Seams SPa may be formed to be spaced apart from each other in the extension portion 162 to correspond to the projections 164a, and may have a shape corresponding to a shape of the projections 164a or a shape further elongated in a direction, perpendicular to the extension direction, than what is illustrated in FIG. 4A.

Referring to FIG. 4B, in a semiconductor 100b, projections 164b of a barrier structure 160b may have a triangular shape or a triangle-like shape such as an equilateral triangular shape. However, in some example embodiments, a corner of each of the projections 164b may have a rounded shape due to process factors such as photolithographic factors.

Seams SPb may be formed to be spaced apart from each other in the extension portion 162 to correspond to the projections 164b, and may have a shape corresponding to a shape of the projections 164 or a shape further curved than the corresponding shape.

As described above, detailed shapes of the projections 164a and 164b may vary according to some example embodiments.

Figure 5:
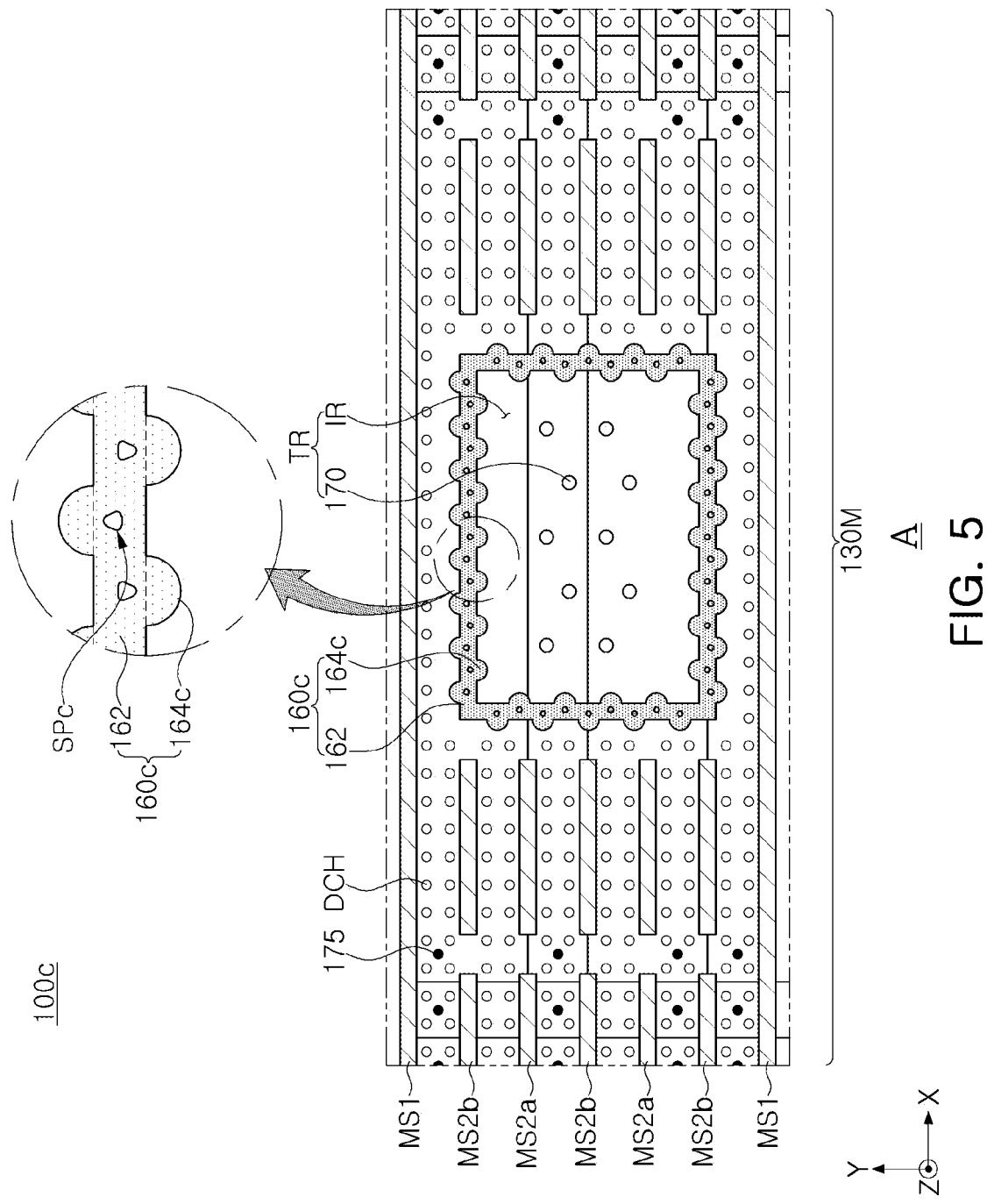
FIG. 5 is a plan view of a semiconductor device according to some example embodiments.

FIG. 5 is a plan view of a semiconductor device according to some example embodiments. FIG. 5 illustrates an enlarged view of region corresponding to region 'A' of FIG. 1A.

Referring to FIG. 5, in a semiconductor device 100c, projections 164c of a barrier structure 160c may be disposed on not only an internal side surface but also an external side surface of the barrier structure 160c. The projections 164c may protrude in opposite directions and may be disposed in zigzag form, on the internal side surface and the external side surface of the barrier structure 160c, but inventive concepts are not limited thereto. For example, the projections 164c may be disposed on a straight line in a direction, perpendicular to an extension direction of the extension portion 162, on the internal side surface and the external side surface of the barrier structure 160c. Although FIG. 5 illustrates the projections 160c as having semicircular shape, example embodiments are not limited thereto. For example, the projections 160c may have a shape other than a semicircular shape, such as triangular and/or rectangular shapes.

Seams SPc may be disposed to be spaced apart from each other to correspond to the projections 164c, and may each have a width decreased in a direction toward the projections 164c, but inventive concepts are not limited thereto.

Figure 6A:
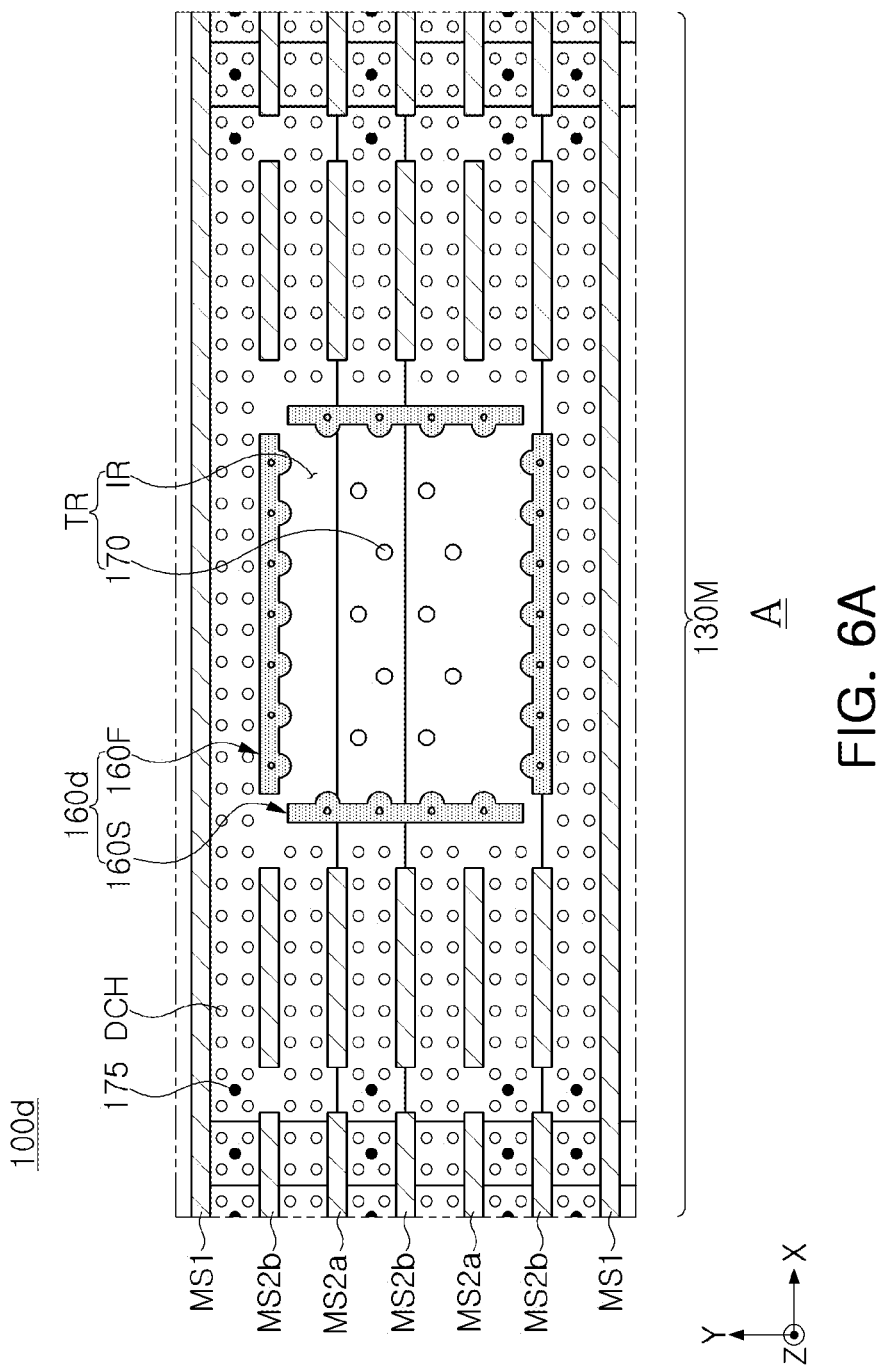
FIGS. 6A to 6C are plan views of a semiconductor device according to some example embodiments.
Figure 6B:
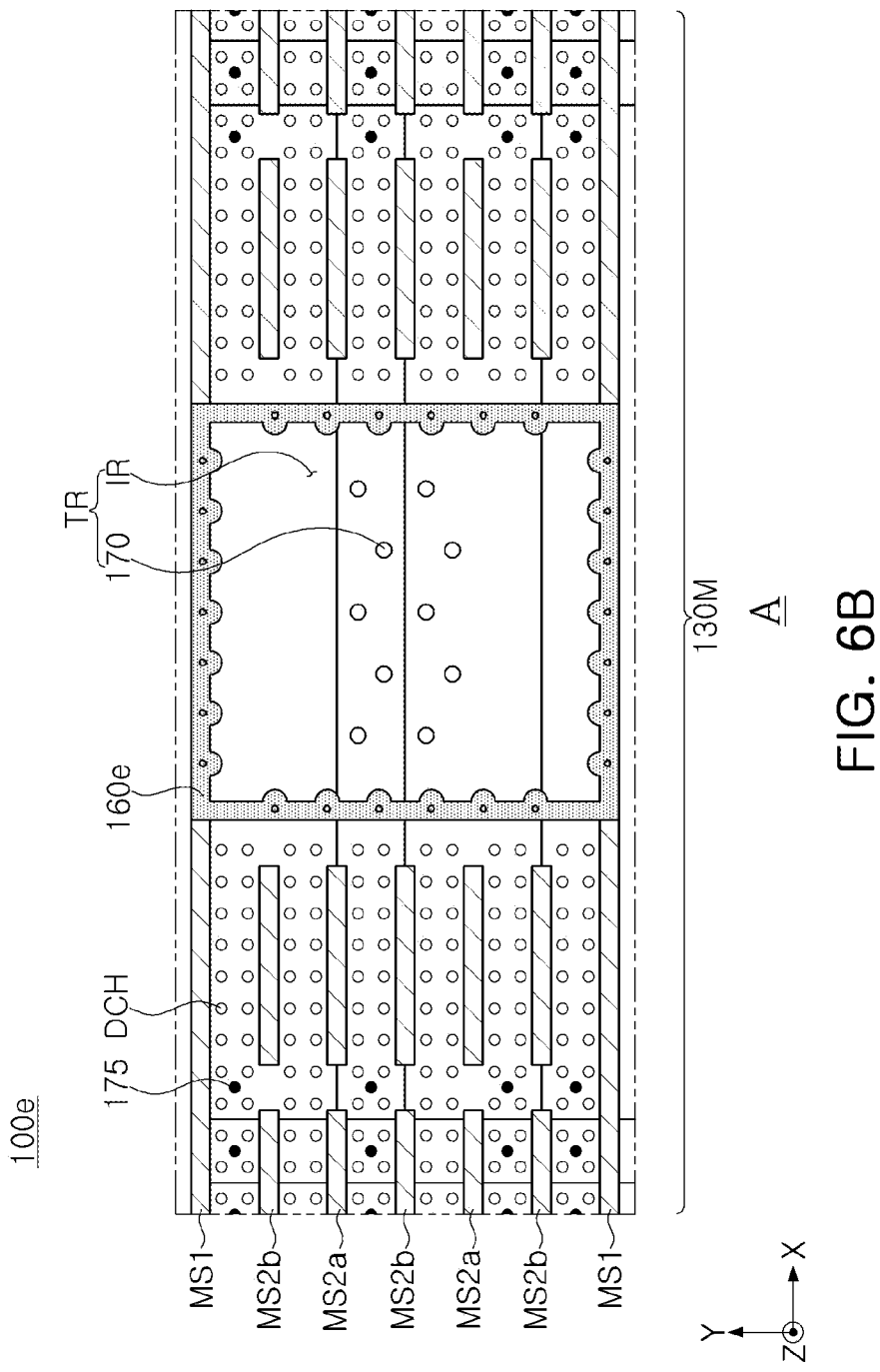
Figure 6C:
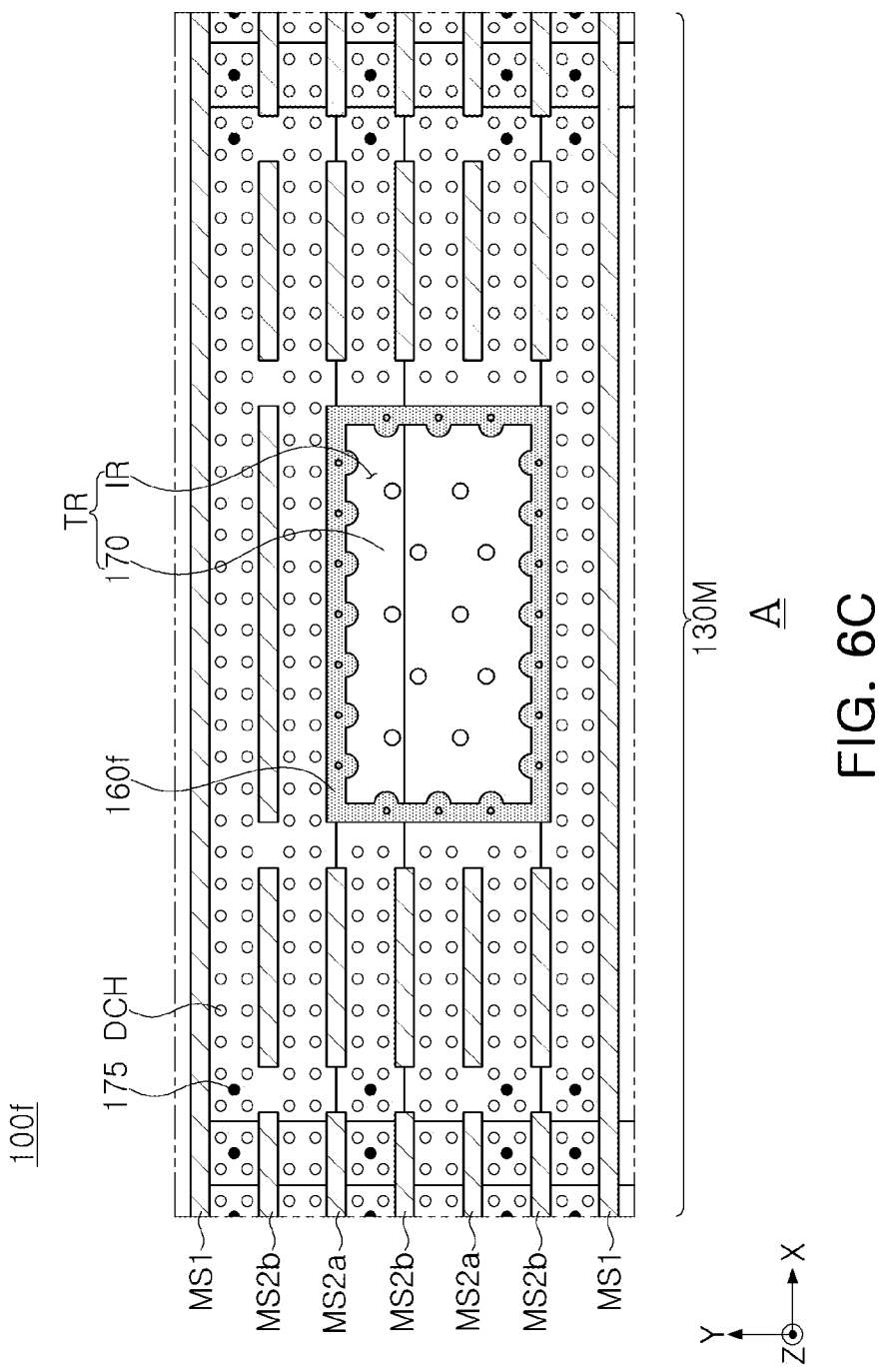

FIGS. 6A to 6C are plan view of a semiconductor device according to some example embodiments. FIGS. 6A to 6C illustrate an enlarged view of region corresponding to region 'A' of FIG. 1A.

Referring to FIG. 6A, in a semiconductor device 100d, a barrier structure 160d may have horizontal regions 160F and vertical regions 160S spaced apart from each other. The horizontal regions 160F may be disposed on a straight line to be parallel to second auxiliary separation regions MS2b adjacent in an X direction. The vertical regions 160S may be disposed between the horizontal regions 160F to extend in a Y direction. A distance between the horizontal regions 160F and the vertical regions 160S, spaced apart from each other, may vary according to some example embodiments.

Referring to FIG. 6B, in a semiconductor device 100e, a barrier structure 160e may be disposed across a pair of first separation regions MS1 adjacent in a Y direction. For example, the barrier structure 160e may be disposed to have a shape extending in the Y direction. In this case, the barrier structure 160e and a through-wiring region TR may not be disposed in or arranged in a second region R2 adjacent in the Y direction. For example, when one through-wiring region TR is disposed for each of a plurality of memory blocks, the disposition of the barrier structure 160e may be changed as described above.

Referring to FIG. 6C, unlike example embodiments of FIG. 1A, in a semiconductor device 100f, a barrier structure 160f may be disposed to have a length decreasing in a Y direction. Among horizontal regions of the barrier structure 160f, one horizontal region may be disposed to be parallel to a second middle separation region MS2a and another horizontal region may be disposed to be parallel to a second auxiliary separation region MS2b. Accordingly, a second auxiliary separation region MS2b may be further disposed between the barrier structure 160f and a first separation region MS1 on one side of the barrier structure 160f in the Y direction.

Figure 7:
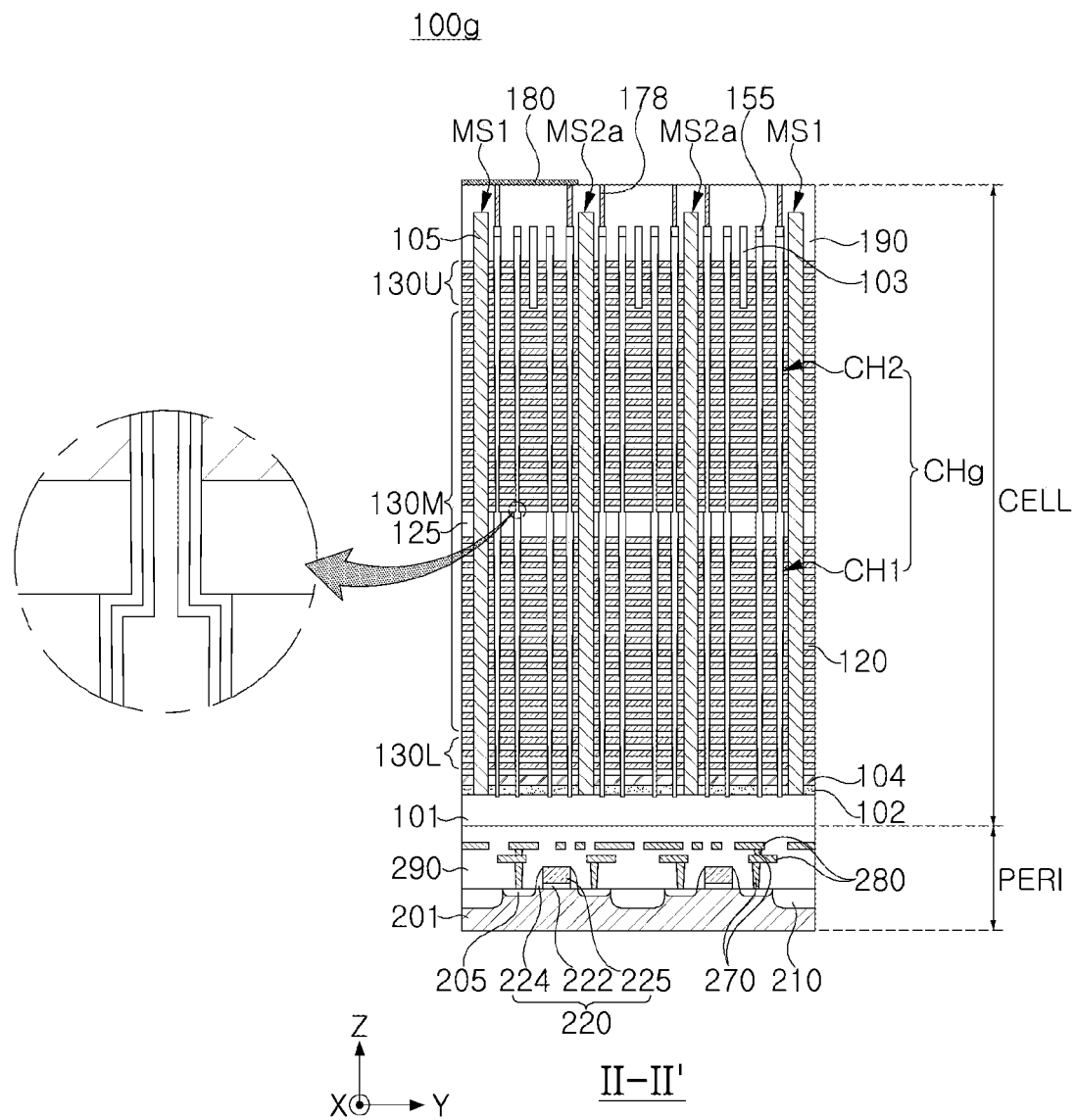
FIG. 7 is a cross-sectional view of a semiconductor device according to some example embodiments.

FIG. 7 is a cross-sectional view of a semiconductor device according to some example embodiments.

Referring to FIG. 7, in a semiconductor device 100g, a stack structure of gate electrodes 130 may include lower and upper stack structures vertically stacked, and channel structures CHg may include first and second channel structures CH1 and CH2 vertically stacked. Dummy channel structures DCH (see FIG. 2A) may be disposed in the same shape as the channel structures CHg. Such a structure of the channels structures CHg may be introduced to stably form the channel structures CHg when there are a great number of gate electrodes 130 relatively stacked.

The channel structures CHg may have a form, in which the first channel structures CH1 disposed below and the second channel structure CH2 disposed above are connected to each other, and may have bent portions formed by a difference in widths in connection regions. A channel layer 140, a gate dielectric layer 145, and a channel buried insulating layer 150 may be connected to each other between the first channel structure CH1 and the second channel structure CH2. The channel pad 155 may be disposed on only an upper end of the upper second channel structure CH2 disposed above. However, in some example embodiments, each of the first channel structure CH1 and the second channel structure CH2 may include a channel pad 155. In this case, the channel pad 155 of the first channel structure CH1 may be connected to the channel layer 140 of the second channel structure CH2. An upper interlayer insulating layer 125 having a relatively large thickness may be disposed on an uppermost portion of the lower stack structure. However, forms of the interlayer insulating layers 120 and the upper interlayer insulating layer 125 may vary according to some example embodiments.

In some example embodiments, the number of stack structures and the number of channel structures stacked in a Z direction may vary.

Example embodiments are not limited to those described above. Furthermore, example embodiments described above are not mutually exclusive to one another, unless clear from context. For example, a semiconductor device according to some example embodiments may include portions of some of the previously described figures, along with portions of other of the previously described figures.

FIGS. 8A to 13C are schematic plan views and cross-sectional views illustrating a method of manufacturing or fabricating a semiconductor device according to some example embodiments.

Figure 8A:
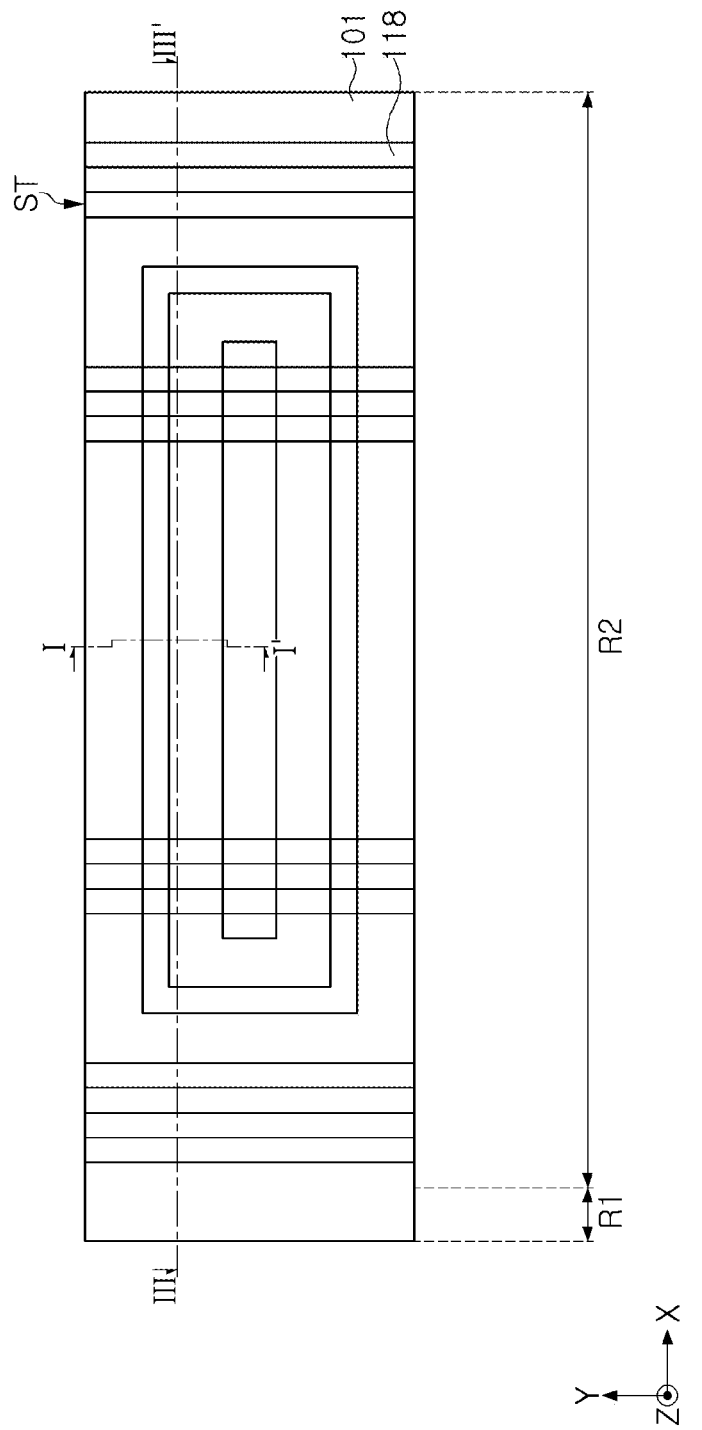
FIGS. 8A to 13C are schematic plan views and cross-sectional views illustrating a method of manufacturing/fabricating a semiconductor device according to some example embodiments.
Figure 8B:
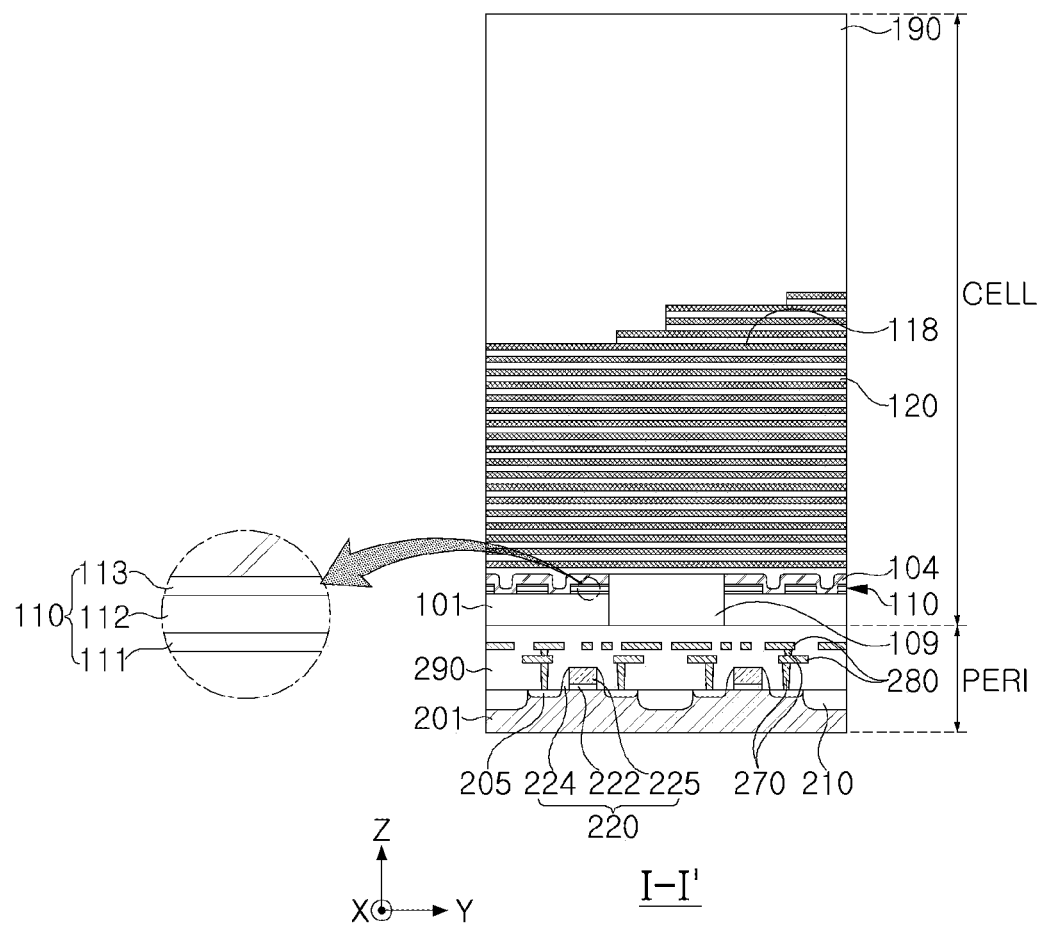
Figure 8C:
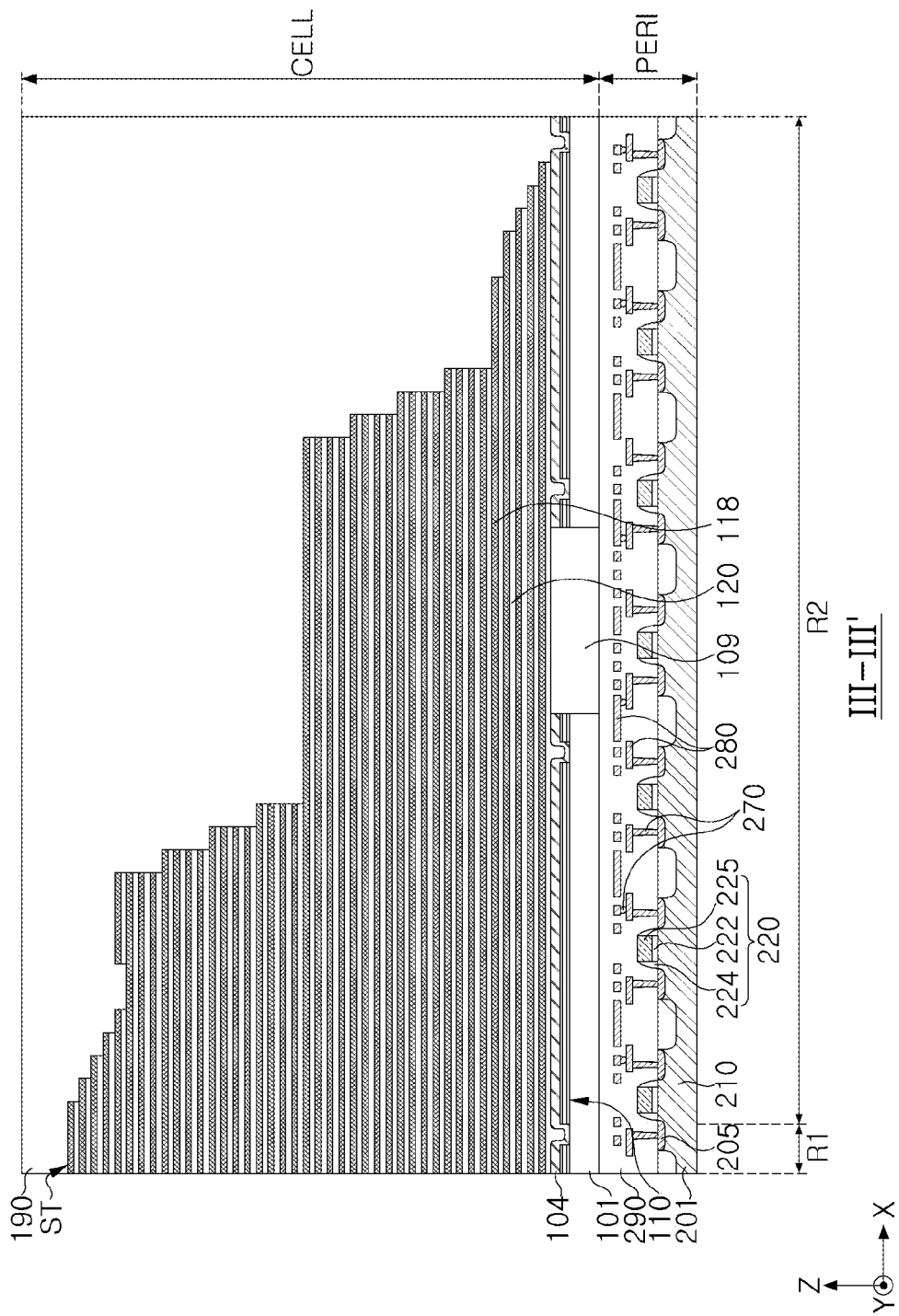

Referring to FIGS. 8A to 8C, a peripheral circuit structure PERI, including circuit elements 220 and lower wiring structures, may be formed on a first substrate 201. A second substrate 101 provided with a memory cell structure CELL thereon, a horizontal insulating layer 110, a second horizontal conductive layer 104, and a substrate insulating layer 109 may be formed above the peripheral circuit region PERI, and then sacrificial insulating layers 118 and interlayer insulating layers 120 may be alternately stacked.

Isolation layers 210 may be formed in the first substrate 201, and a circuit gate dielectric layer and a circuit gate electrode 225 may be sequentially formed on the first substrate 201. The isolation layers 210 may be formed by, for example, a shallow trench isolation (STI) process. The isolation layers 210 may be formed with a deposition process and/or a spin-on glass process. The circuit gate dielectric layer 222 and the circuit gate electrode 225 may be formed using atomic layer deposition (ALD) and/or chemical vapor deposition (CVD) and/or thermal oxidation. The circuit gate dielectric layer 222 may be formed of at least one of polysilicon and metal silicide, and inventive concepts are not limited thereto. Then, a space layer 224 and source/drain regions 205 may be formed on both sidewalls of the circuit gate dielectric layer 222 and the circuit gate electrode 225. The source/drain regions 205 may be formed with an implantation process such as a beamline ion-implantation process; however, example embodiments are not limited thereto. According to some example embodiments, the spacer layer 224 may include a plurality of layers. Then, an ion implantation process such as a beamline ion-implantation process and/or a plasma-assisted doping (PLAD) process may be performed to form the source/drain regions 205.

In the lower wiring structures, circuit contact plugs 270 may be formed by forming a portion of a peripheral insulating layer 290, etching the portion of the peripheral insulating layer 290 to be removed, and burying a conductive material. Circuit wiring lines 280 may be formed by, for example, depositing a conductive material and patterning the deposited conductive layer. The conductive material may be deposited with a chemical vapor deposition (CVD) process and/or a physical vapor deposition (PVD) process.

The peripheral insulating layer 290 may include a plurality of insulating layers. A portion of the peripheral insulating layer 290 may be formed in the respective processes of forming the lower wiring structures, and the other portion of the peripheral insulating layer 290 may be formed above an uppermost circuit wiring line 280. Ultimately, the peripheral insulating layer 290 may be formed to cover circuit elements 220 and the lower wiring structures.

Then, the second substrate 101 may be formed on the peripheral insulating layer 290. The second substrate 101 may be formed of, for example, polysilicon such as undoped or doped polysilicon and may be formed by a CVD process. The polysilicon, forming the second substrate 101, may include impurities.

First to third horizontal insulating layers 111, 112, and 113, constituting or included in a horizontal insulating layer 110, may be sequentially stacked on the second substrate 101. A portion of the horizontal insulating layer 110 may be replaced with the first horizontal conductive layer 102 of FIG. 2B through a subsequent process. The first and third horizontal insulating layers 111 and 113 may include, e.g. consist of, a material different from a material of the second horizontal insulating layer 112. For example, the first and third insulating layers 111 and 113 may include or consist of the same material as an interlayer insulating layer 120, and the second horizontal insulating layer 112 may include or consist of the same material as a sacrificial insulating layer 118. The horizontal insulating layer 110 may be removed in some regions by a patterning process.

The second horizontal conductive layer 104 may be formed on the horizontal insulating layer 110 and may be in contact with the second substrate 101 in a region in which the horizontal insulating layer 110 is removed. Accordingly, the second horizontal conductive layer 104 may be bent, e.g. may be conformal, along end portions of the horizontal insulating layer 110 and may extend onto the second substrate 101 while covering the end portions of the horizontal insulating layer 110.

The substrate insulating layer 109 may be formed by removing portions of the second substrate 101, the horizontal insulating layer 110, and the second horizontal conductive layer 104 in a region, corresponding to a through-wring region TR (see FIG. 2A), and burying an insulating material. The substrate insulating layer 190 may be formed in portions of or an entirety of a through-wiring region TR or may be formed to be smaller than when formed in the entire through-wiring region TR. After filling the removed portions with the insulating material, a planarization process may be further performed using a chemical mechanical polishing (CMP) process and/or an etch-back process. Thus, an upper surface of the substrate insulating layer 109 may be substantially coplanar with an upper surface of the second horizontal conductive layer 104.

Portions of the sacrificial insulating layers 118 may be replaced with gate electrodes 130 (see FIG. 2A) through a subsequent process. The sacrificial layers 118 may include or consist of a material or materials different from a material of the interlayer insulating layer 120, and may be formed of a material which may be etched with etch selectivity with respect to the interlayer insulating layers 120 under a specific etching condition. For example, the interlayer insulating layer 120 may include at least one of silicon oxide and silicon nitride, and the sacrificial insulating layers 118 may include a material, selected from the group consisting of or including silicon, silicon oxide, silicon carbide, and silicon nitride, different from the material of the interlayer insulating layer 120. In some example embodiments, the interlayer dielectric layers 120 may not have the same thickness. The thicknesses and the number of layers of the interlayer insulating layers 120 and the sacrificial insulating layers 118 may be variously modified from what is illustrated in the drawings.

Figure 9A:
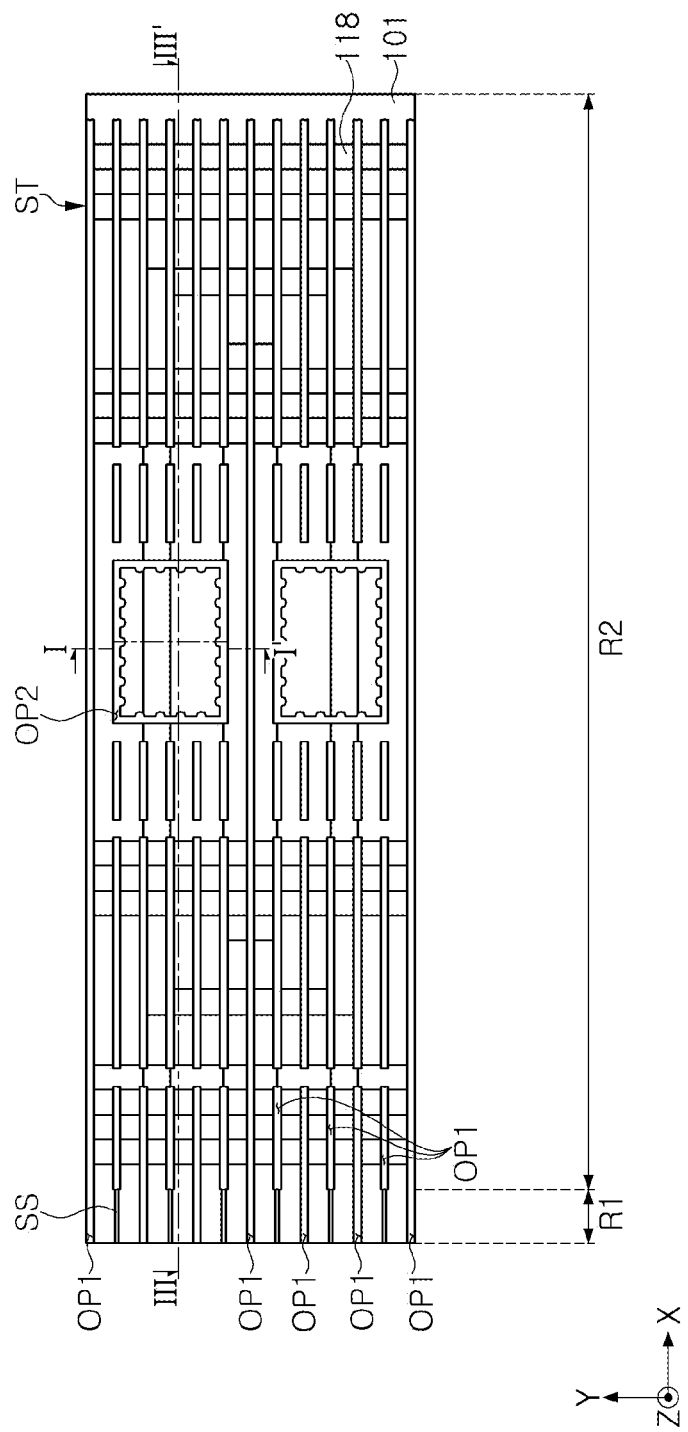
Figure 9B:
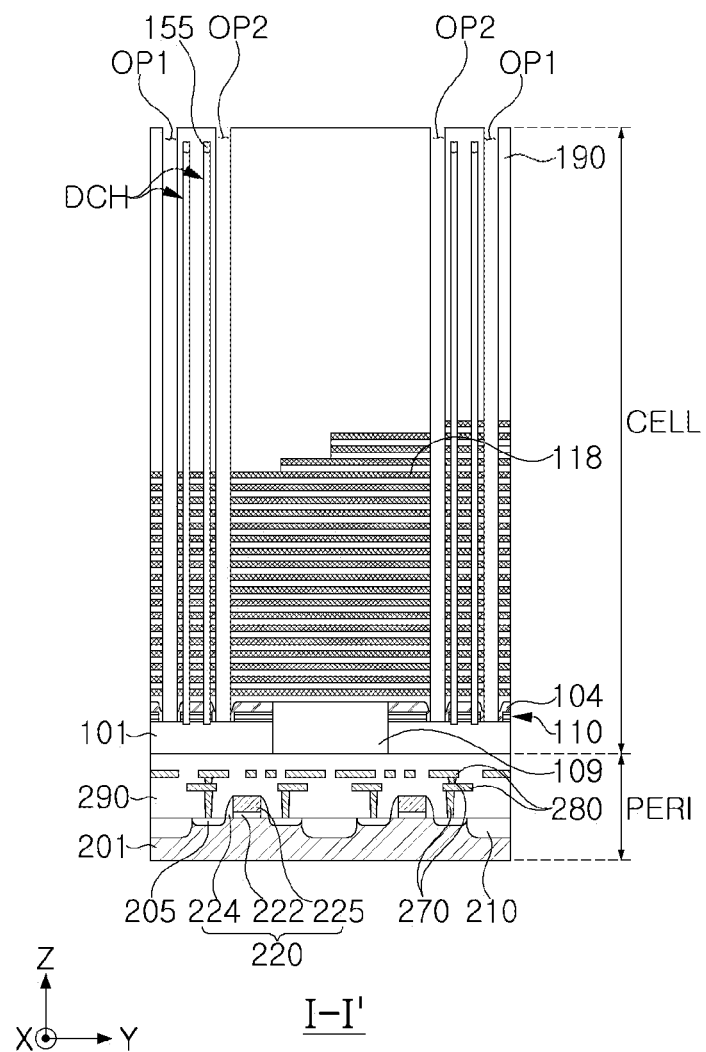
Figure 9C:
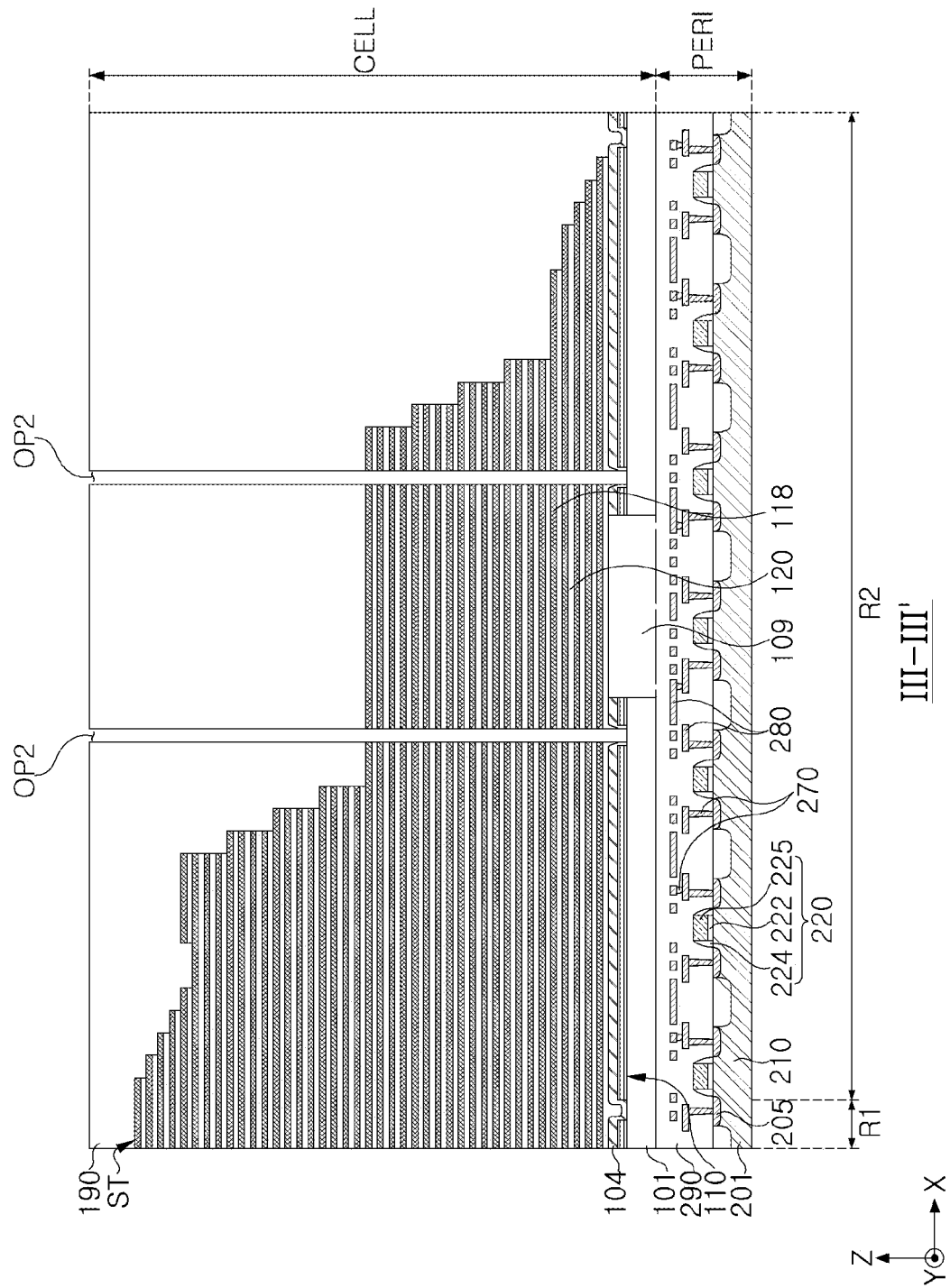

Referring to FIGS. 9A to 9C, channel structures CH (see FIG. 2B) and dummy channel structures DCH may be formed to penetrate through a stack structure of the sacrificial insulating layers 118 and the interlayer insulating layers 120, and openings OP1 and OP2 may be formed to penetrate through the stack structure.

Portions of the interlayer insulating layers 118 and the interlayer insulating layers 120 may be removed to form an upper separation region SS. The upper separation region SS may be formed by exposing a region, in which the upper separation region SS is to be formed, using an additional mask layer, removing a specific (or, alternatively, predetermined) number of sacrificial layers 118 and interlayer insulating layers 120 from an uppermost portion, and depositing an insulating material. The upper separation region SS may extend further downwardly in a Z direction than a region in which upper gate electrodes 130U of FIG. 2B are formed.

Then, the channel structures CH and the dummy channels structures DCH may be formed by anisotropically etching, e.g. with a dry etching process, the sacrificial insulating layers 118, the interlayer insulating layers 120, and the horizontal insulating layer 110, and may be formed by forming hole-shaped channel holes and filling the channel holes. In some example embodiments, the dummy channel structures DCH may have a larger size than the channels structures CH. Due to a height of the stack structure, sidewalls of the channels holes may not be perpendicular to the upper surface of the second substrate 101. A profile of the dummy channel structures DCH may be tapered. Alternatively or additionally, a profile of the channel structures CH may be tapered. The channel holes may be formed to recess a portion of the second substrate 101.

Then, among the openings OP1 and OP2, the first openings OP1 may be formed in positions of the first and second separation regions MS1, MS2a, and MS2b of FIG. 1A, and the second opening OP2 may be formed in a position of the barrier structure 160 of FIG. 1A. Prior to the formation of the openings OP1 and OP2, a cell insulating layer 190 may be further formed on the channel structures CH and the dummy channel structures DCH. The openings OP1 and OP2 may be formed by forming a mask layer using a photolithography process and anisotropically etching the stack structure. The first openings OP1 may be formed to have a trench shape extending in the x direction, and the second openings OP2 may be formed to have a rectangular ring shape or a rectangular ring-like shape. The second opening OP2 may have a curvature formed on an internal side surface thereof by projections, when viewed from above.

Figure 10A:
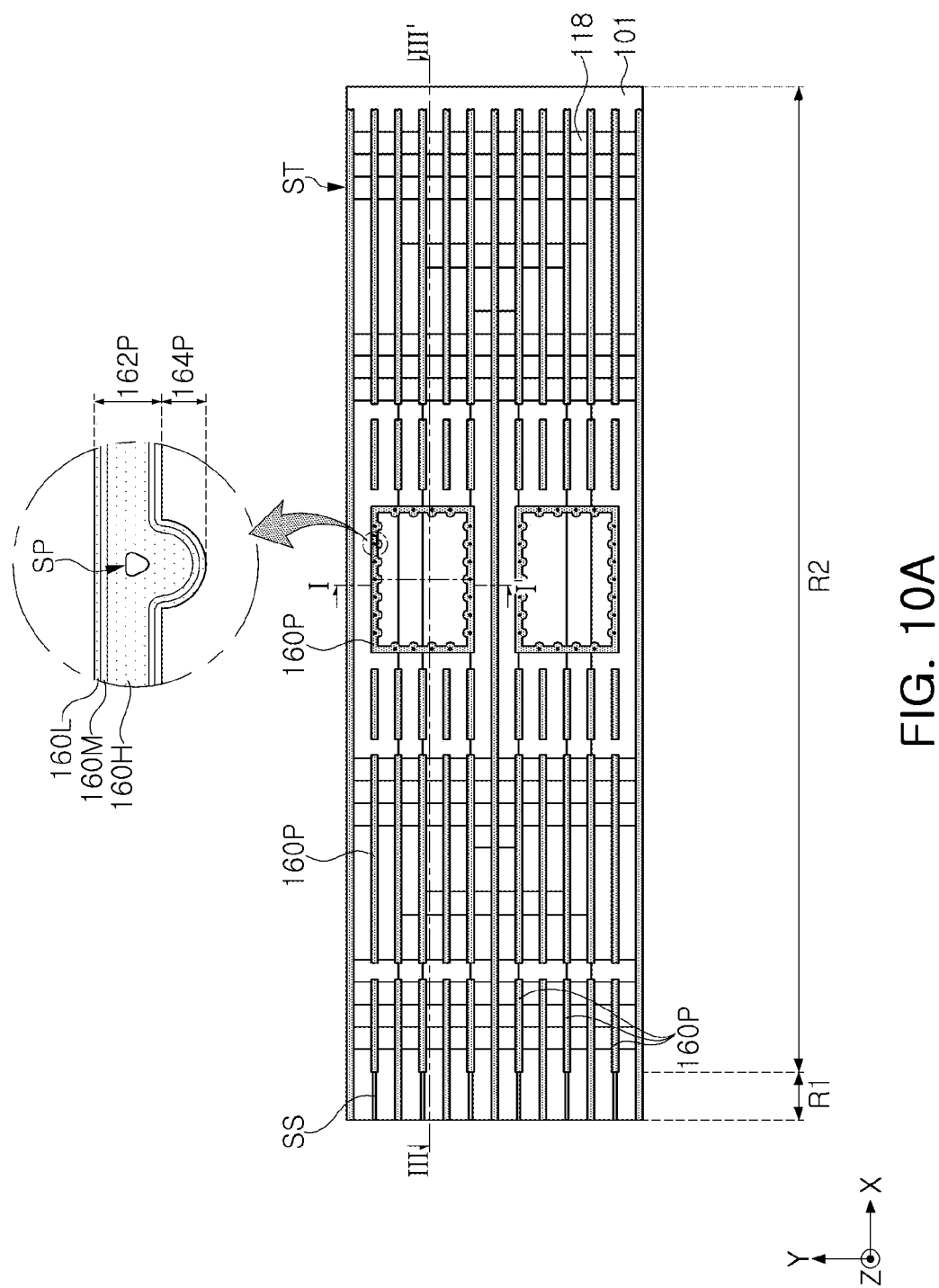
Figure 10B:
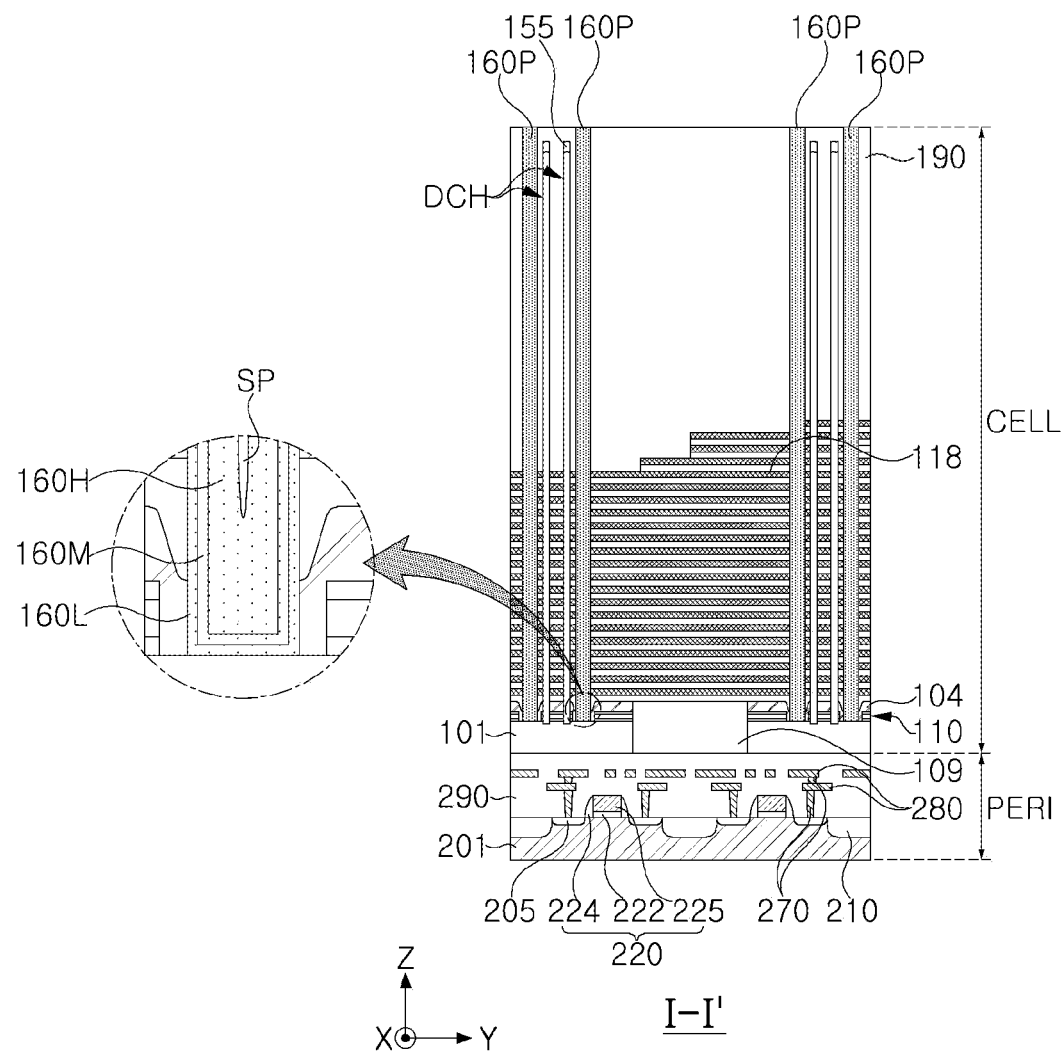
Figure 10C:
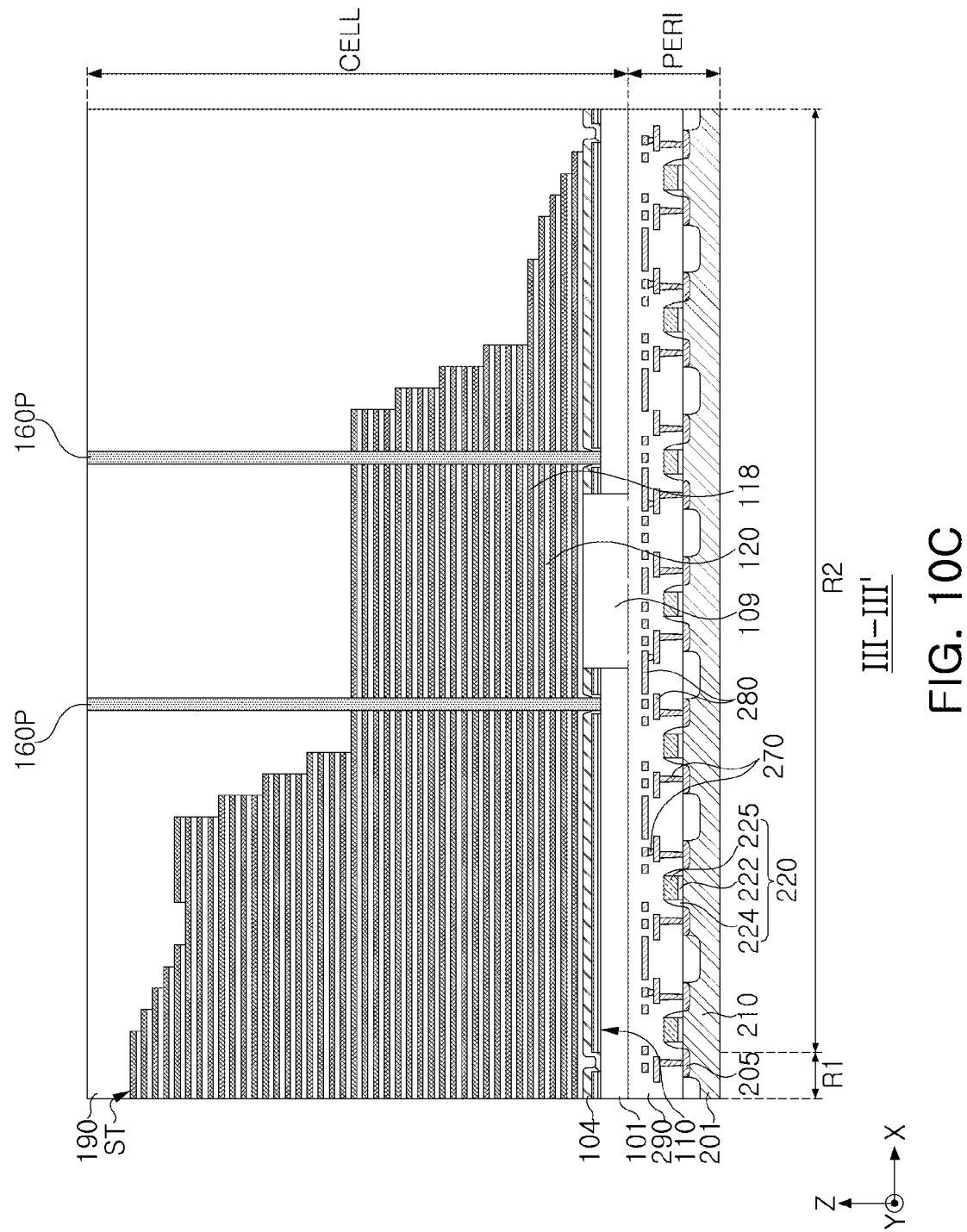

Referring to FIGS. 10A to 10C, first to third barrier layers 160L, 160M, and 160H may be stacked in the openings OP1 and OP2 to form a preliminary barrier structure 160P.

The first to third barrier layers 160L, 160M, and 160H may be sequentially stacked along internal side surfaces and bottom surfaces of the openings OP1 and OP2. Each of the first and second barrier layers 160L and 160M may be formed to have a smaller thickness than the third barrier layer 160H. The first to third barrier layers 160L, 160M, and 160H may include different materials. For example, the first barrier layer 160L may have a material different from the material of the sacrificial insulating layers 118 to have etch selectivity with respect to the sacrificial insulating layers 118.

In the preliminary barrier structure 160P, seams SP may be formed in a region including a center, e.g. a center of the preliminary barrier structure 160P. The second opening OP2 may include regions having relatively large width due to the projections, and may continuously receive a deposition material from the regions. Thus, a seam continuously extending in an extension portion 162P having a relatively small width may not be formed, and seams SP may be locally formed within only the extension portion 162P in a region corresponding to the projections 164P.

Figure 11A:
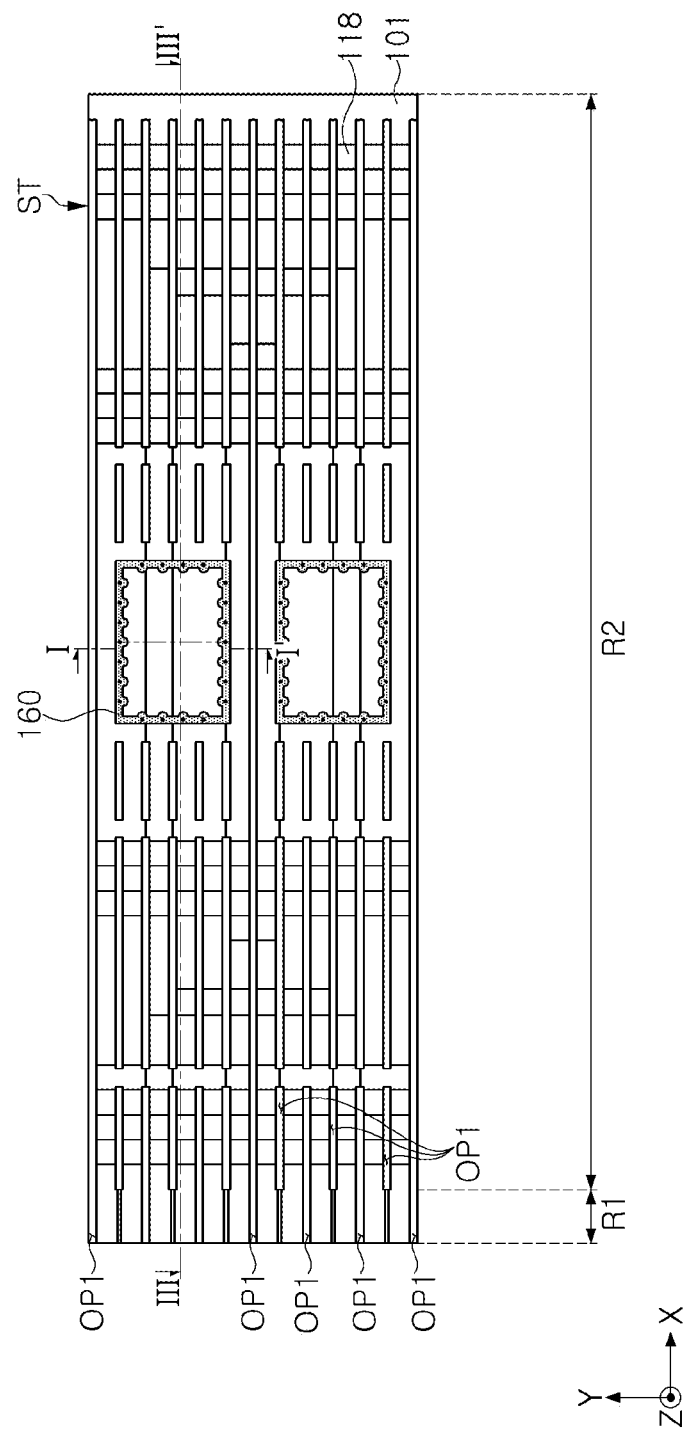
Figure 11B:
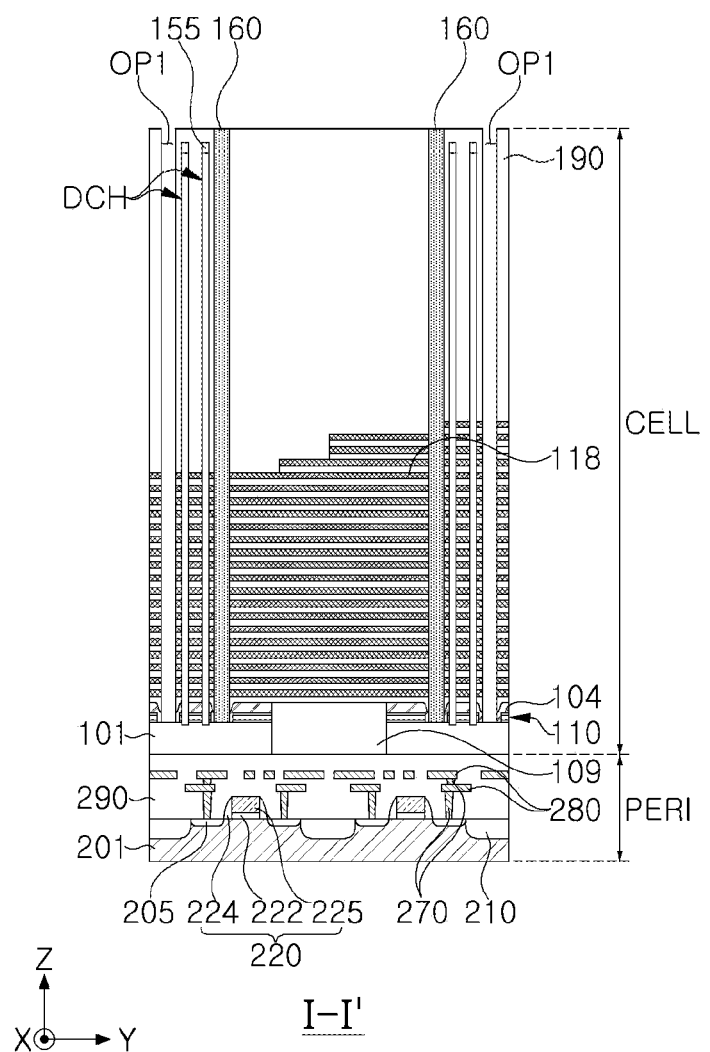
Figure 11C:
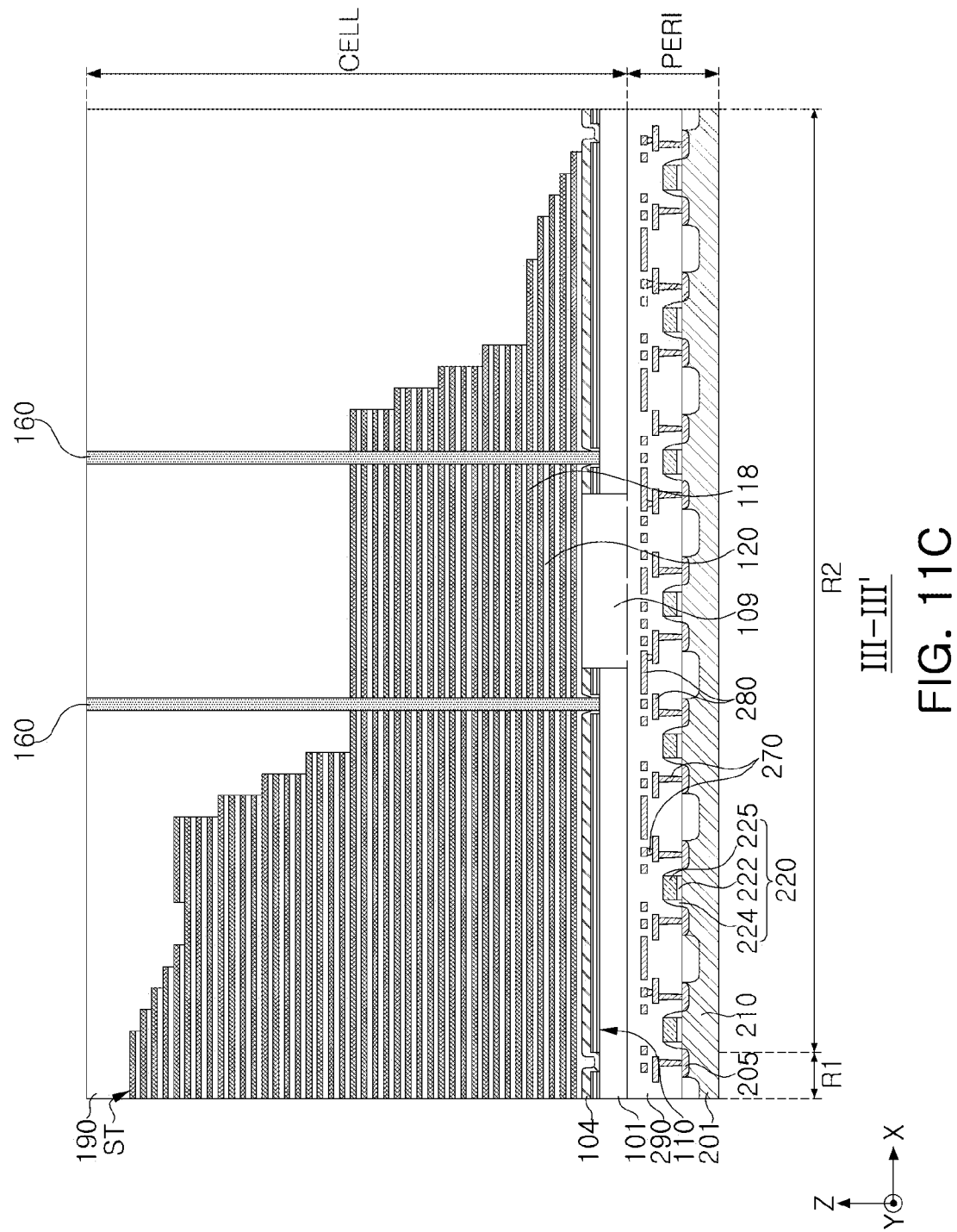

Referring to FIGS. 11A to 11C, the preliminary barrier structure 160P may be removed from the first openings OP1.

The first openings OP1 may be re-formed by covering an upper region of the second opening OP2 using an additional mask layer and removing the preliminary barrier structure 160P in only the first openings OP1. The preliminary structure 160P may remain in the second opening OP2 to constitute a barrier structure 160.

Figure 12A:
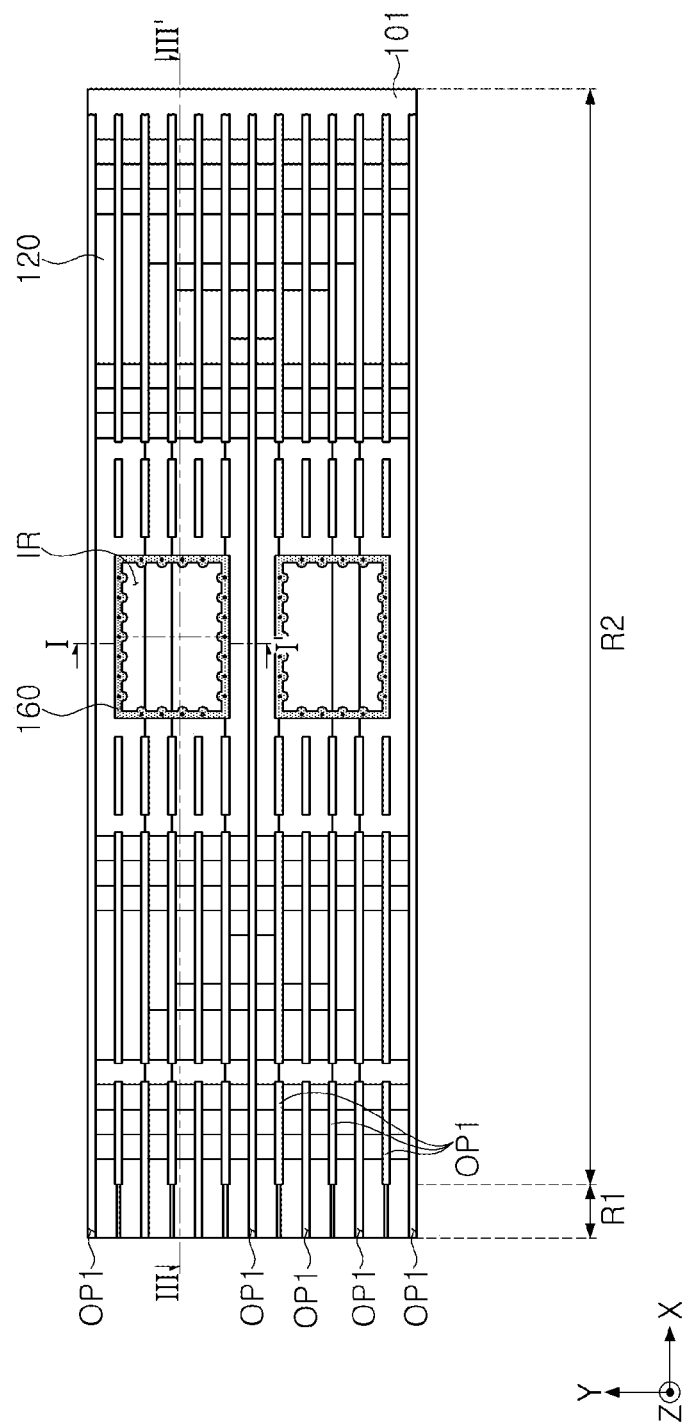
Figure 12B:
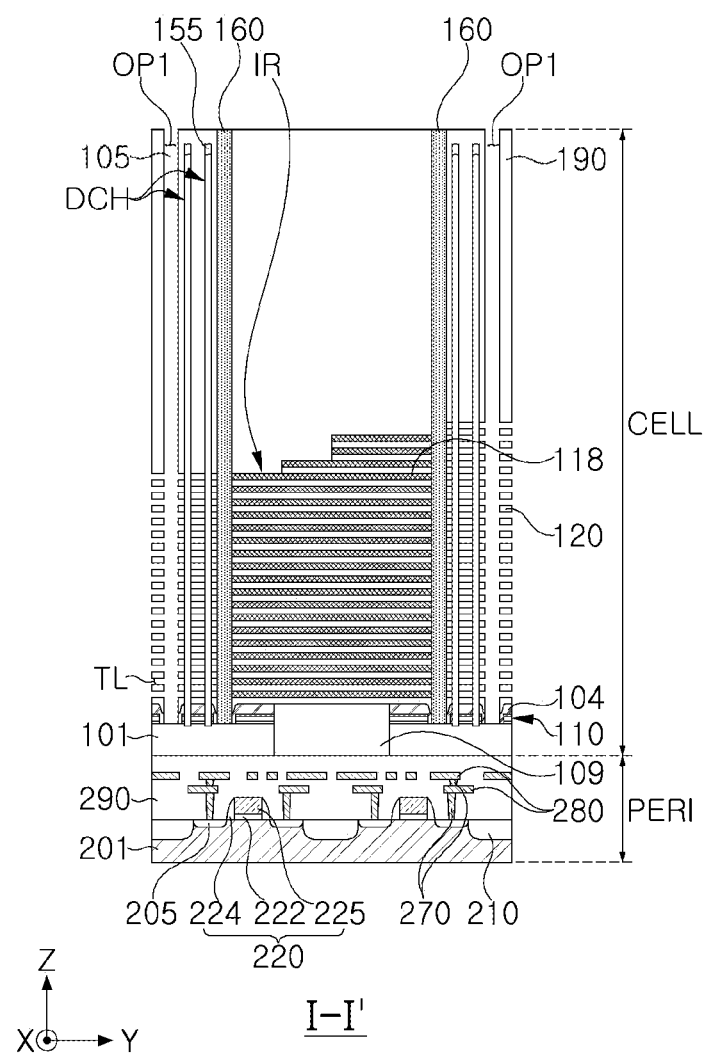
Figure 12C:
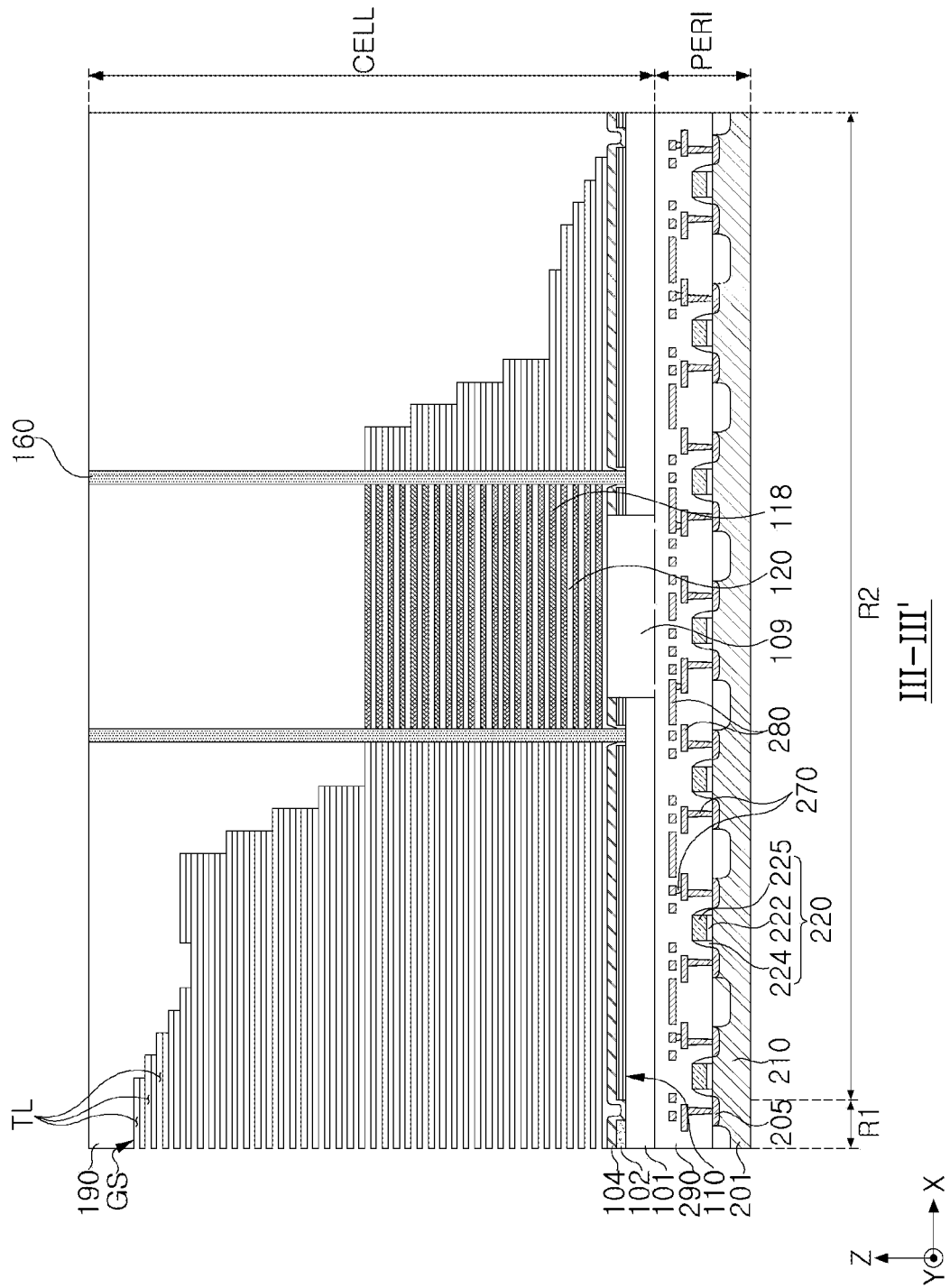

Referring to FIGS. 12A to 12C, tunnel portions TL may be formed by removing portions of the sacrificial insulating layer 118 through the first openings OP1 after forming the first horizontal conductive layer 102.

While forming additional sacrificial spacer layers in the first openings OP1, an etch-back process may be performed to expose the second horizontal insulating layer 112 in a first region R1 such as FIG. 2B. The second horizontal insulating layer 112 may be selectively removed from the exposed region, and then the first and third horizontal insulating layers 111 and 113 disposed above and below the second horizontal insulating layer 112 may be removed.

The first to third horizontal insulating layers 111, 112, and 113 may be removed by, for example, a wet etching process. In the process of removing the first to third horizontal insulating layers 111, 112, and 113, a portion of an exposed gate dielectric layer 145 may also be removed together in the region in which the second horizontal insulating layer 112 is removed. A conductive material may be deposited in the region, in which the first to third horizontal insulating layers 111, 112, and 113 are removed, to form a first horizontal conductive layer 102, and then the sacrificial spacer layers may be removed in the openings. According to some example embodiments, the first horizontal conductive layer 102 may be formed in a first region A.

Then, the sacrificial insulating layers 118 may be removed on an external side of a through-wiring region TR (see FIG. 2A). In the through-wiring region TR, the sacrificial insulating layers 118 may remain to constitute an insulating region IR of the through-wiring region TR together with the interlayer insulating layers 120 and the substrate insulating layer 109. The sacrificial insulating layers 118 may be selectively removed, with respect to the interlayer insulating layers 120, the second horizontal conductive layer 104, and the substrate insulating layer 109, using wet etching, for example. Accordingly, a plurality of tunnel portions TL may be formed between the interlayer insulating layers 120.

Since a region, in which the through-wiring region TR is formed, is spaced apart from the first openings OP1, an etchant does not reach the region, allowing the sacrificial insulating layers 118 to remain. Accordingly, the through-wiring region TR may be formed in the center of adjacent first and second separation regions MS1, MS2a, and MS2b between the first and second separation regions MS1, MS2a, and MS2b. Alternatively or additionally, since introduction of the etchant is blocked by the barrier structure 160, a region in which the sacrificial insulating layers 118 are removed may be more precisely controlled. A region in which the sacrificial layers 118 remain may match a region in which the substrate insulating layer 109 is disposed, but is not limited thereto.

Figure 13A:
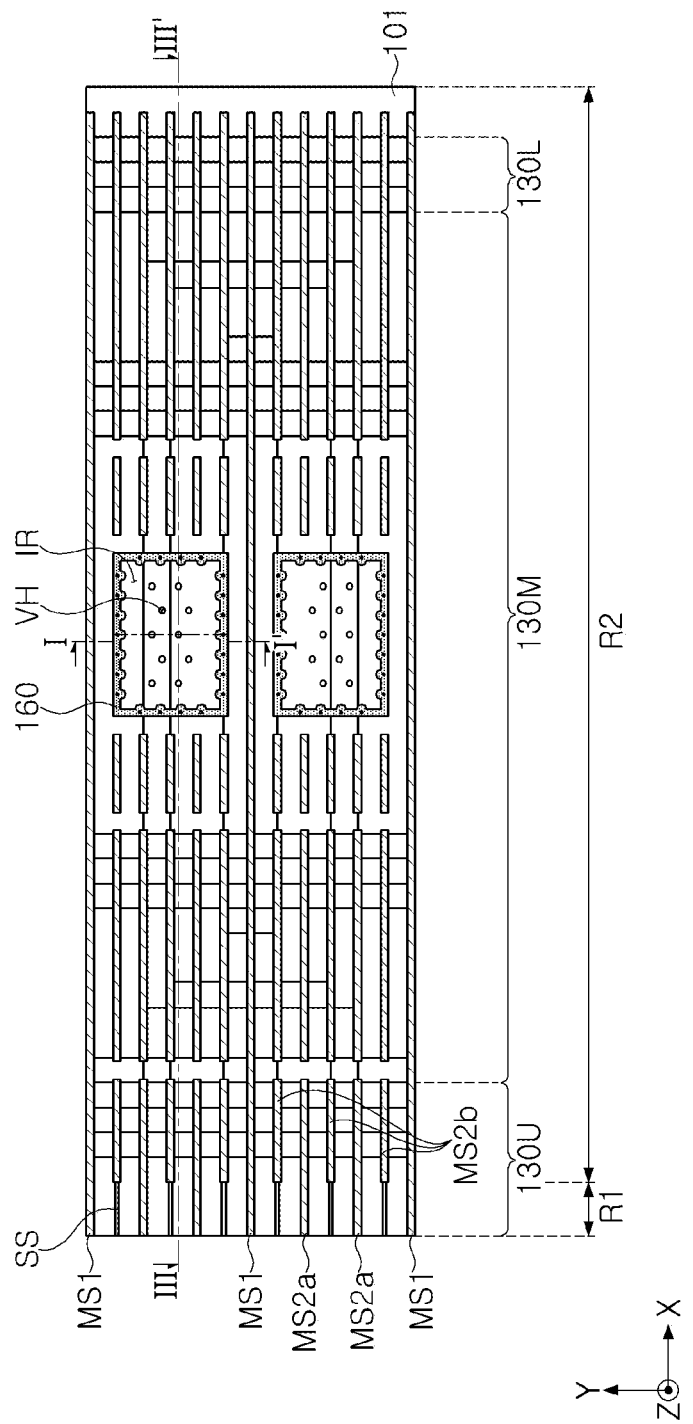
Figure 13B:
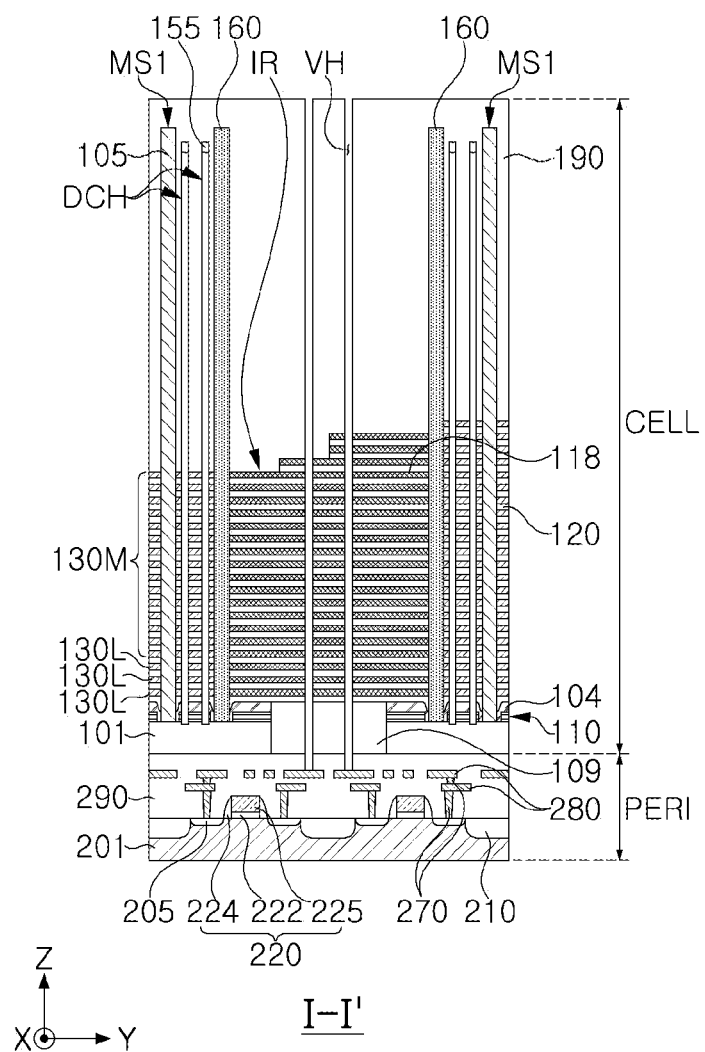
Figure 13C:
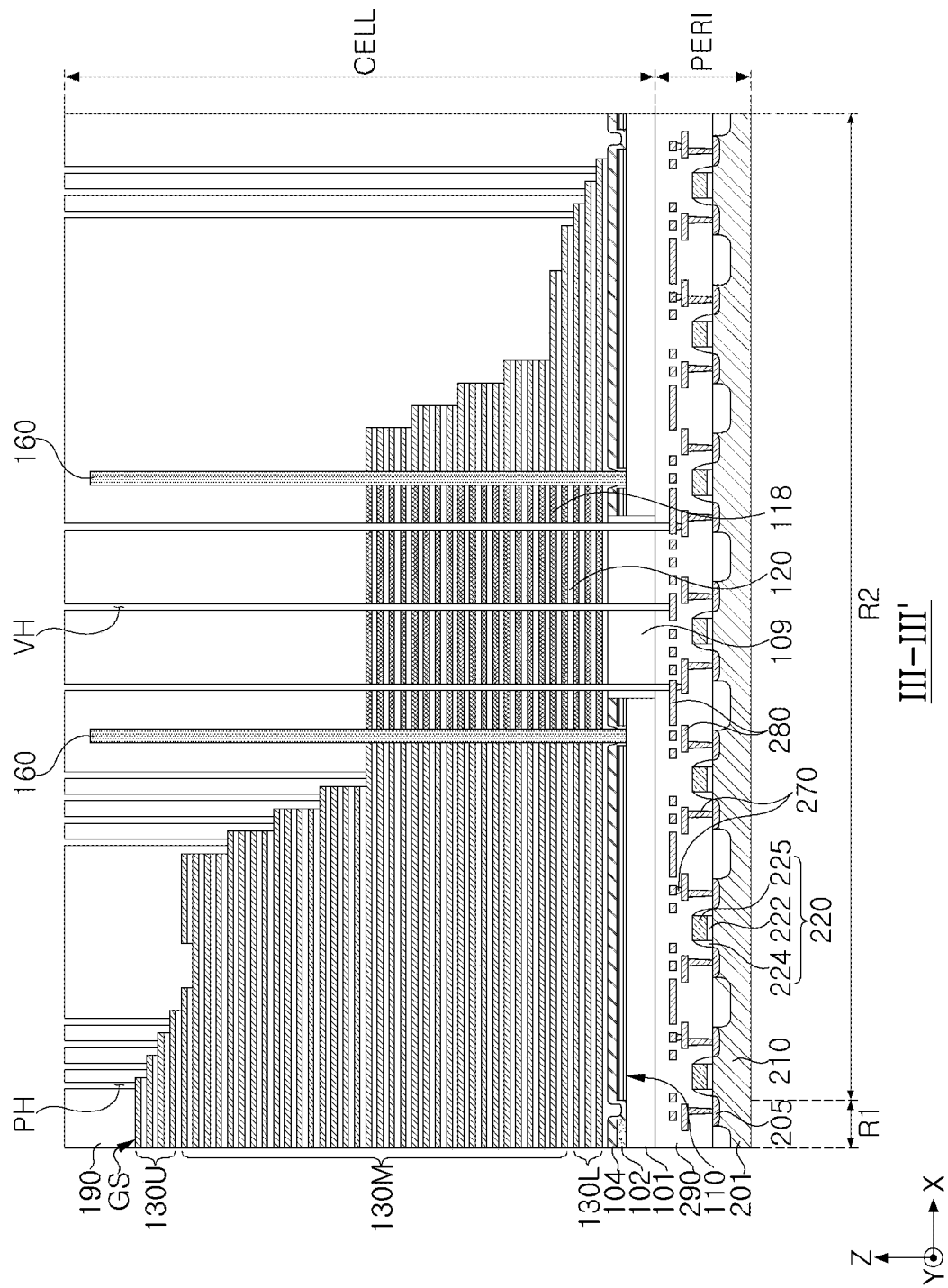

Referring to FIGS. 13A to 13C, a conductive material may be buried in the tunnel portions TL to form gate electrodes 130, separation insulating layers 105 may be formed in the first openings OP1, and via holes for formation of through-contact plugs 170 (see FIG. 2A) may be formed in the through-wiring region TR.

The conductive material, forming the gate electrodes 130, may fill the tunnel portions TL. The conductive material may include a metal, polysilicon, or a metal silicide material. Side surfaces of the gate electrodes 130 may be in contact with a side surface of the barrier structure 160. The barrier structure 160 may prevent or reduce the likelihood of the conductive material from flowing into the through-wiring region TR during formation of the gate electrodes 130. After the gate electrodes 130 are formed, the conductive material deposited in the first openings OP1 may be removed through an additional process. The separation insulating layer 105 may be formed to fill the first openings OP1.

Before the via holes VH are formed, a cell insulating layer 190 may be further formed to cover the separation insulating layer 105. Then, via holes VH may be formed to penetrate through the cell insulating layer 190 and the insulating regions IR. A circuit wiring line 280 of the peripheral circuit structure PERI may be exposed on lower ends of the via holes VH. Accordingly, holes PH for forming gate contact plugs 175 (see FIG. 2C) connected to the gate electrodes 130 may be formed together.

Referring to FIGS. 1A to 2C together, a conductive material may be buried in the via holes VH such that through-contact plugs 170 may be formed to form a through-wiring region TR, and upper plugs 178 and wiring lines 180 may be formed to be connected to upper ends of the through-contact plugs 170. As a result, a semiconductor device 100 may be manufactured or fabricated.

Figure 14:
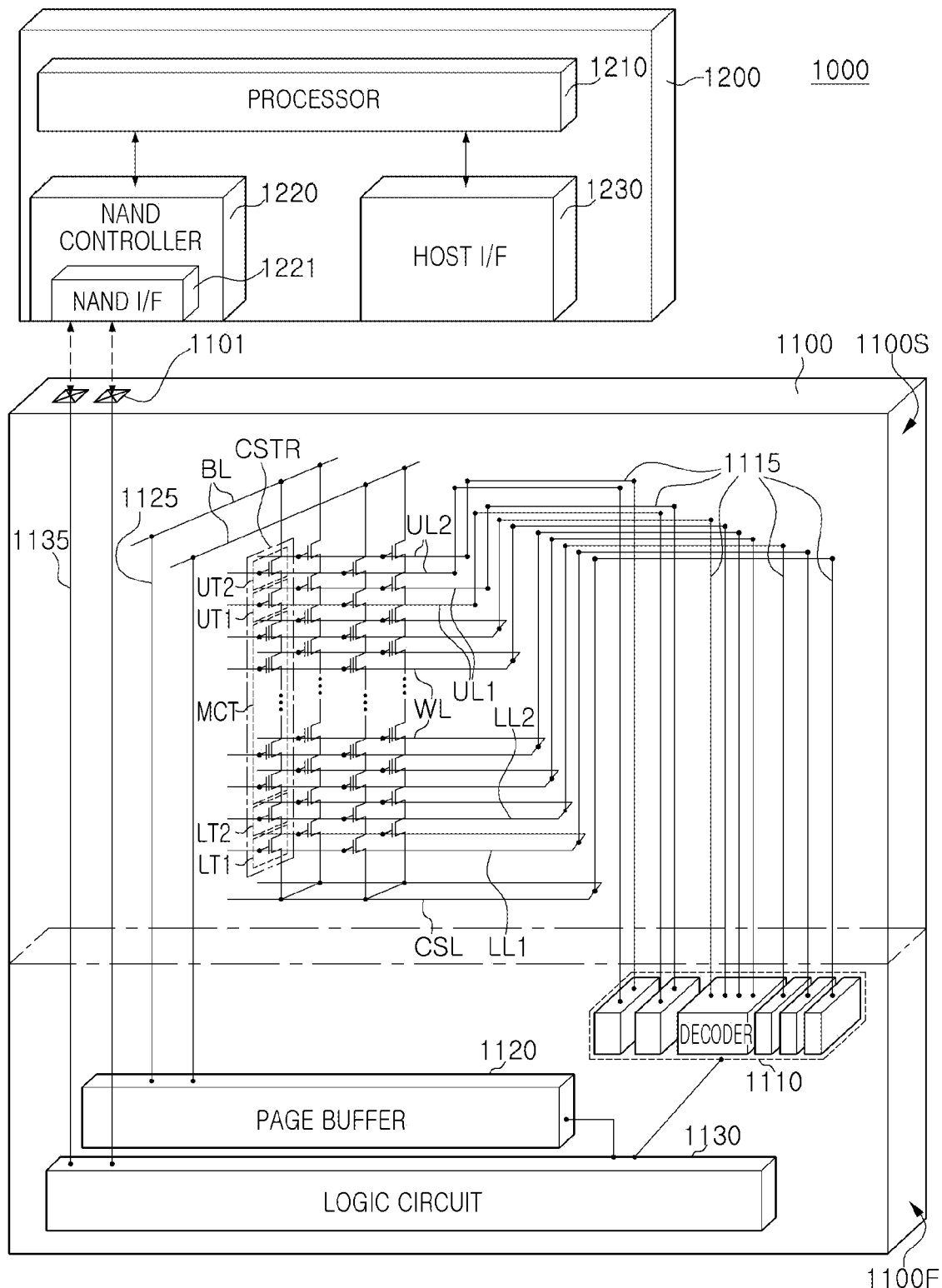
FIG. 14 is a schematic view of a data storage system including a semiconductor device according to some example embodiments.

FIG. 14 is a schematic view of a data storage system including a semiconductor device according to some example embodiments.

Referring to FIG. 14, a data storage system 1000 may include a semiconductor device 1100 and a controller 1200 electrically connected to the semiconductor device 1100. The data storage system 1000 may be a storage device, including one or more semiconductor devices 1100, or an electronic device including a storage device. For example, the data storage system 1000 may be or include a solid state drive device (SSD) device including one or more semiconductor devices 1100, a universal serial bus (USB), a computing system, a medical device, or a communications device.

The semiconductor device 1100 may be or include a nonvolatile memory device and may be, for example, the NAND flash memory device described with reference to FIGS. 1 to 7. The semiconductor device 1100 may include a first structure 1100F and a second structure 1100S on the first structure 1100F. In some example embodiments, the first structure 1100F may be or include a peripheral circuit structure including a decoder circuit 1110, a page buffer 1120, and a logic circuit 1130. The second structure 1100S may a memory cell structure including a bit line BL, a common source line CSL, word lines WL, first and second upper gate lines UL1 and UL2, first and second lower gate lines LL1 and LL2, and memory cell strings CSTR between the bit line BL and the common source line CSL.

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The number of the lower transistors LT1 and LT2 and the number of the upper transistors UT1 and UT2 may vary according to some example embodiments.

In some example embodiments, the upper transistors UT1 and UT2 may include string select transistor, and the lower transistors LT1 and LT2 may include a ground select transistor. The lower gate lines LL1 and LL2 may be gate electrodes of the lower transistors LT1 and LT2, respectively. The word lines WL may be gate electrodes of the memory cell transistors MCT, and the upper gate lines UL1 and UL2 may be gate electrodes of the upper transistors UT1 and UT2, respectively.

In some example embodiments, the lower transistors LT1 and LT2 may include a lower erase control transistor LT1 and a ground select transistor LT2 connected in series. The upper transistors UT1 and UT2 may include a string select transistor UT1 and an upper erase control transistor UT2 connected in series. At least one of the lower erase control transistor LT1 and the upper erase control transistor UT1 may be used in an erase operation in which data, stored in memory cell transistors MCT, is erased using gate induced drain leakage (GIDL) current.

The common source line CSL, the first and second lower gate lines LL1 and LL2, the word lines WL, and the first and second upper gate lines UL1 and UL2 may be electrically connected to the decoder circuit 1110 through first connection wirings 1115, extending to the second structure 1100S, within the first structure 1100F. The bit lines BL may be connected to the page buffer 1120 through second connection wirings 1125, extending to the second structure 1100S, within the first structure 1100F.

In the first structure 1100F, the decoder circuit 1110 and/or the page buffer 1120 may execute a control operation for at least one memory cell transistor MCT, among a plurality of memory cell transistors MCT. The decode circuit 1110 and the page buffer 1120 may be controlled by the logic circuit 1130. The semiconductor device 1000 may communicate with the controller 1200 through an input/output (I/O) pad 1101 electrically connected to the logic circuit 1130. The I/O pad 1101 may be electrically connected to the logic circuit 1130 through an input/output (I/O) connection wiring 1135, extending to the second structure 1100S, within the first structure 1100F.

The controller 1200 may include a processor 1210, a NAND controller 1220, and a host interface 1230. According to some example embodiments, the data storage system 1000 may include a plurality of semiconductor devices 1100. In this case, the controller 1200 may control the plurality of semiconductor devices 1100.

The processor 1210 may control overall operation of the data storage system 1000 including the controller 1200. The processor 1210 may operate based on predetermined firmware, and may control a NAND controller 1220 to access the semiconductor device 1100. The NAND controller 1220 may include a NAND interface 1221 processing communications with the semiconductor device 1100. A control command for controlling the semiconductor device 1100, data to be written to the memory cell transistors MCT of the semiconductor device 1100, data to be read from the memory cell transistors MCT of the semiconductor device 1100, and the like, may be transmitted through the NAND interface 1221. The host interface 1230 may provide a communications function between the data storage system 1000 and an external host. When a control command is received from the external host through the host interface 1230, the process 1210 may control the semiconductor device 1100 in response to the control command.

Figure 15:
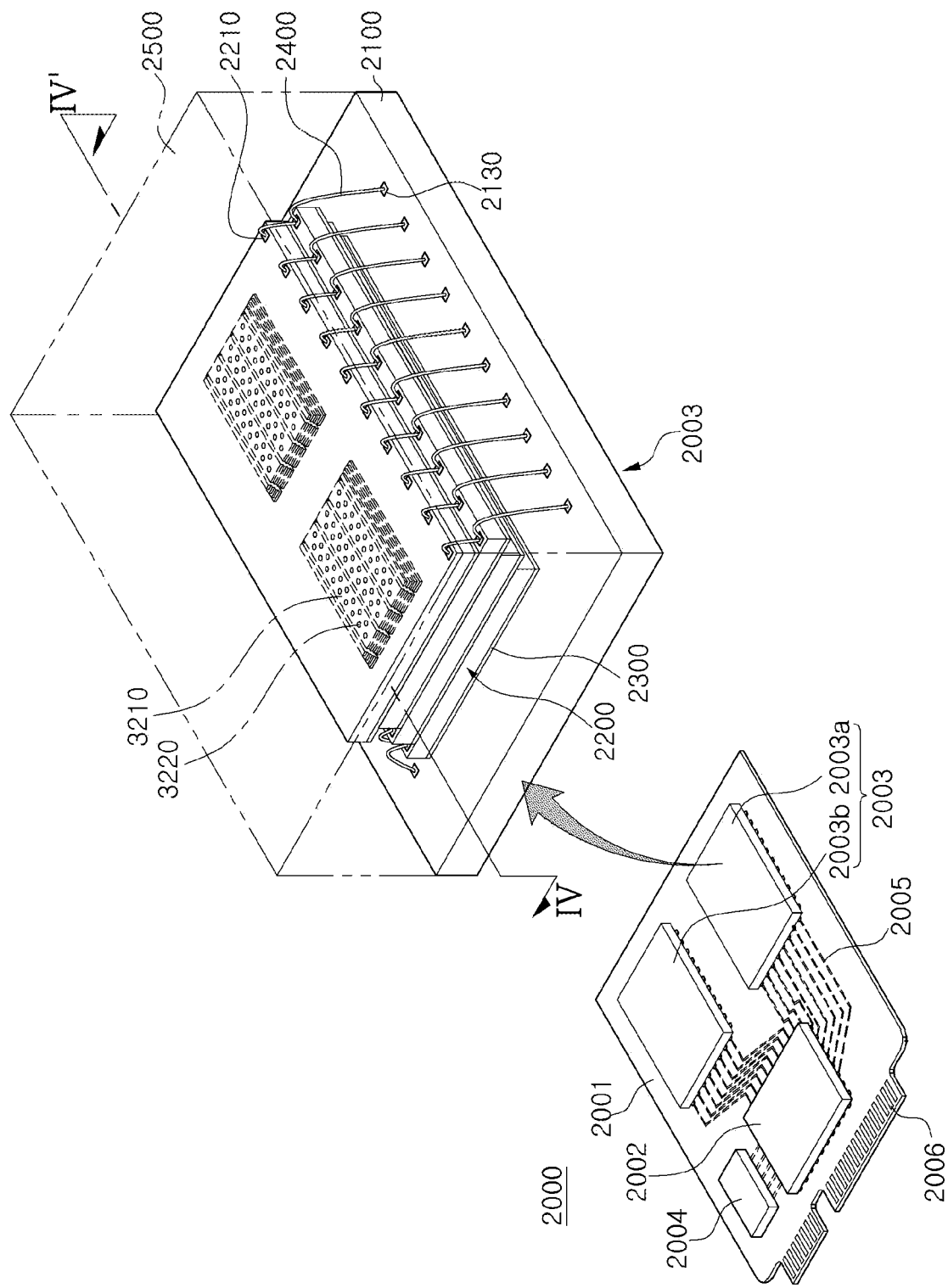
FIG. 15 is a schematic view of a data storage system including a semiconductor device according to some example embodiments.

FIG. 15 is a schematic view of a data storage system including a semiconductor device according to some example embodiments.

Referring to FIG. 15, a storage system 2000 according to some example embodiments may include a main substrate 2001, a controller 2002 mounted on the main substrate 2001, one or more semiconductor packages 2003, and a DRAM 2004. The semiconductor package 2003 and the DRAM 2004 may be connected to the controller 2002 through wiring patterns 2005 formed on the main substrate 2001.

The main substrate 2001 may include a connector 2006 including a plurality of pins coupled to the external host. In the connector 2006, the number and disposition of the plurality of pins may vary depending on a communications interface between the data storage system 2000 and the external host. In some example embodiments, the data storage system 2000 may communicate with the external host based on an interface, among interfaces such as universal serial bus (USB), peripheral component interconnect express (PCI-Express), serial advanced technology attachment (SATA), M-PHY for universal flash storage (UFS), and the like. In example embodiments, the data storage system 2000 may operate with power supplied from the external host through a connector 2006. The data storage system 2000 may further include a power management integrated circuit (PMIC) dividing the power, supplied from the external host, to the controller 2002 and the semiconductor package 2003.

The controller 2002 may write data to the semiconductor package 2003 or read data from the semiconductor package, and may increase operating speed of the data storage system 2000.

The DRAM 2004 may be or include a buffer memory for reducing a difference in speeds between the semiconductor package 2002, used as a data storage space, and the external host. The DRAM 2004, included in the data storage system 2000, may operate as a type of cache memory and may provide a space for temporarily storing data during a control operation for the semiconductor package 2003. When the DRAM 2004 is included in the data storage system 2000, the controller 2002 may further include a DRAM controller for controlling the DRAM 2004, in addition to a NAND controller for controlling the semiconductor package 2003.

The semiconductor package 2003 may include first and second semiconductor packages 2003*a* and 2003*b* spaced apart from each other. Each of the first and second semiconductor packages 2003*a* and 2203*b* may be a semiconductor package including a plurality of semiconductor chips 2200. Each of the first and second semiconductor packages 2003*a* and 2003*b* may include a package substrate 2100, semiconductor chips 2200 on the package substrate 2100, adhesive layers 2300, respectively disposed on lower surfaces of the semiconductor chips 2200, a connection structure 2400 electrically connecting the semiconductor chips 2200 and the package substrate 2100 to each other, and a molding layer 2500 covering the semiconductor chips 2200 and the connection structure 2400 on the package substrate 2100.

The package substrate 2100 may be a printed circuit board (PCB) including an upper package pads 2130. Each of the semiconductor chips 2200 may include an input/output (I/O) pad 2210. The I/O pad 2210 may correspond to the I/O pad 1101 of FIG. 14. Each of the semiconductor chips 2200 may include gate stack structures 3210 and channel structures 3220. Each of the semiconductor chips 2200 may include the semiconductor device described with reference to FIGS. 1 to 7.

In some example embodiments, the connection structure 2400 may be a bonding wire electrically connecting the I/O pad 2210 and the upper package pads 2130 to each other. Accordingly, in each of the first and second semiconductor packages 2003*a* and 2003*b*, the semiconductor chips 2200 may be electrically connected to each other by wire bonding, and may be electrically connected to the upper package pads 2130 of the package substrate 2100. According to some example embodiments, in each of the first and second semiconductor packages 2003*a* and 2003*b*, the semiconductor chips 2200 may be electrically connected to each other by a connection structure including a through-silicon via (TSV) rather than the connection structure 2400 using wire bonding.

In some example embodiments, the controller 2002 and the semiconductor chips 2200 may be included in a single package. In some example embodiments, the controller 2002 and the semiconductor chips 2200 may mounted on an additional interposer substrate, different from the main substrate 2001, and the controller 2002 and the semiconductor chips 2200 may be connected to each other by a wiring formed on the interposer substrate.

Figure 16:
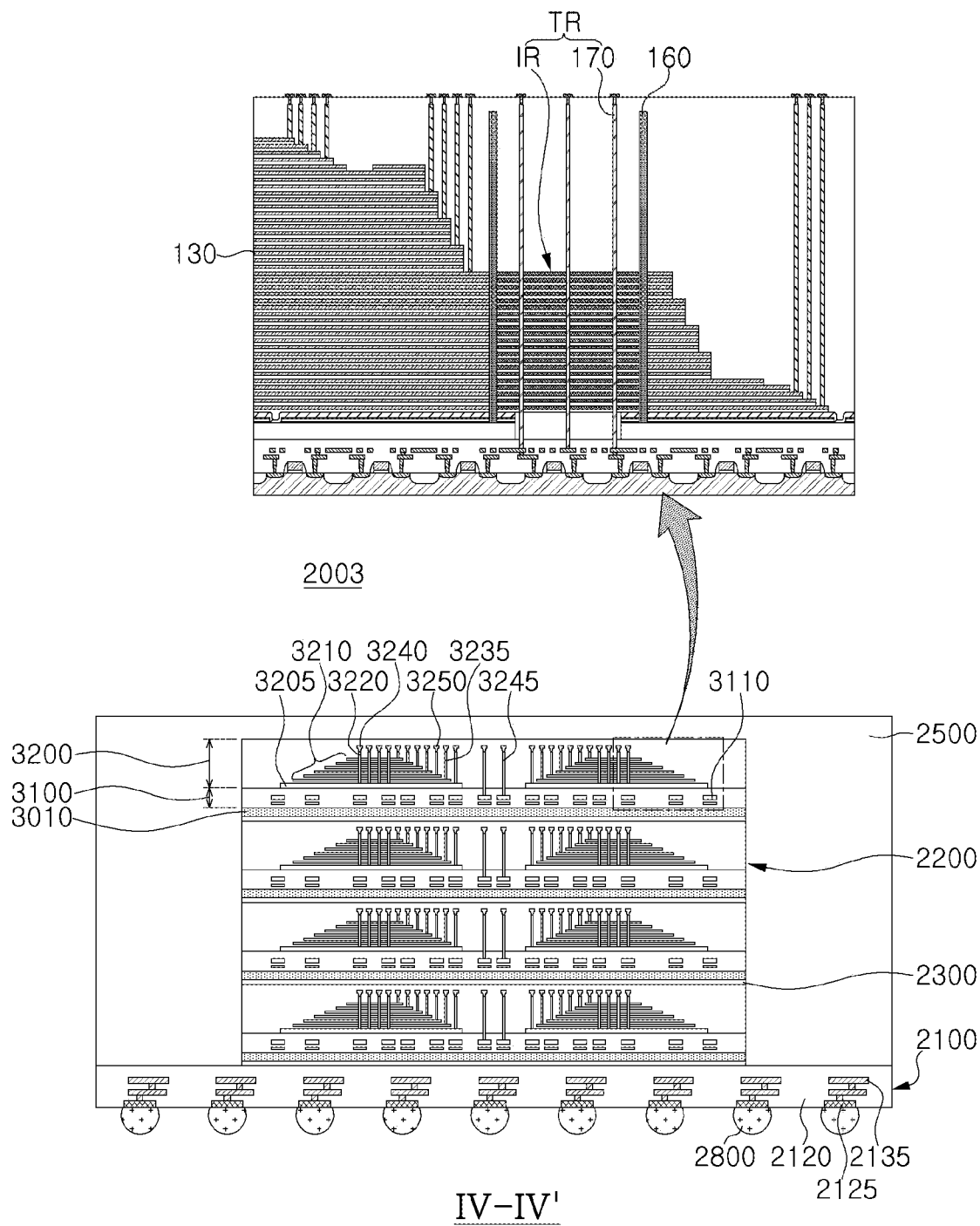
FIG. 16 is a schematic cross-sectional view of a semiconductor package according to some example embodiments.

FIG. 16 is a schematic cross-sectional view of a semiconductor package according to some example embodiments. FIG. 16 illustrates an example embodiment of the semiconductor package 2003 of FIG. 15, and conceptually illustrates a region cut along line IV-IV' of the semiconductor package 2003 of FIG. 15.

Referring to FIG. 16, in a semiconductor package 2003, a package substrate 2100 may be a printed circuit board (PCB). The package substrate 2100 may include a package substrate body portion 2120, upper package pads 2130 (see FIG. 15) disposed on an upper surface of the package substrate body portion 2120, lower pads 2125 disposed on a lower surface of the package substrate body portion 2120 or exposed through the lower surface of the package substrate body portion 2120, and internal wirings 2135 electrically connecting the upper package pads 2130 and the lower pads 2125 to each other inside the package substrate body portion 2120. The upper package pads 2130 may be electrically connected to the connection structures 2400. The lower pads 2125 may be connected to wiring patterns 2005 of the main substrate 2010 of the data storage system 2000, as illustrated in FIG. 15, through conductive connection portions 2800.

Each of the semiconductor chips 2200 may include a semiconductor substrate 3010, and a first structure 3100 and a second structure 3200 sequentially stacked on the semiconductor substrate 3010. The first structure 3100 may have a peripheral circuit region including peripheral wirings 3110. The second structure 3200 may include a common source line 3205, a gate stack structure 3210 on the common source line 3205, channel structures 3220 and separation regions 3230 penetrating through the gate stacking structure 3210, bit lines 3240 electrically connected to the memory channel structures 3220, and gate contact plugs 3235 electrically connected to word lines WL (see FIG. 14) of the gate stack structure 3210. As described above with reference to FIGS. 1A to 3, in each of the semiconductor chips 2200, a barrier structure 160 surrounding a through-wiring region TR may have an internal surface having a projection.

Each of the semiconductor chips 2200 may include a through-wiring 3245 electrically connected to peripheral wirings 3110 and extending inwardly of the second structure 3200. The through-wiring 3245 may be disposed on an external side of the gate stack structure 3210, and may be further disposed to penetrate through the gate stack structure 3210. Each of the semiconductor chips 2200 may further include an input/output (I/O) pad 2210 (see FIG. 15) electrically connected to the peripheral wirings 3110 of the first structure 3100.

Any of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

As described above, a semiconductor device may include a barrier structure in which regions having different widths are formed. Accordingly, a semiconductor device having improved reliability and a data storage system including the same may be provided.

While some example embodiments have been shown and described above, it will be apparent to those of ordinary skill in the art that modifications and variations could be made without departing from the scope of the inventive concepts as defined by the appended claims.

What is claimed is:

1. A semiconductor device comprising:
a peripheral circuit structure including a first substrate and active or passive circuits on the first substrate;
a memory cell structure including (A) a second substrate on the peripheral circuit structure and having a first region and a second region, (B) gate electrodes stacked on the first region to be spaced apart from each other in a first direction and extending on the second region in a second direction, the gate electrodes in a staircase shape, (C) interlayer insulating layers stacked alternately with the gate electrodes, (D) channel structures penetrating through the gate electrodes, the channel structures extending in the first direction, each of the channel structures including a channel layer, and (E) separation regions penetrating through the gate electrodes, the separation regions extending in the second direction and spaced apart from each other in a third direction, wherein the semiconductor device has a through-wiring region including (A) sacrificial insulating layers parallel to the gate electrodes in the second region and alternately stacked with the interlayer insulating layers, and (B) a through-contact plug electrically connecting the gate electrodes with the active or passive circuits; and
a barrier structure surrounding the through-wiring region and having an internal side surface having projections
wherein the barrier structure includes a first barrier layer, a second barrier layer, and a third barrier layer, and the first barrier layer includes a material different from a material of the sacrificial insulating layers.

2. The semiconductor device of claim 1, wherein an external side surface of the barrier structure contacts the gate electrodes, and the internal side surface of the barrier structure contacts the sacrificial insulating layers.

3. The semiconductor device of claim 1, wherein the barrier structure extends with a first width, and on the projections has a second width greater than the first width.

4. The semiconductor device of claim 3, wherein the second width ranges from about 1.3 times to about 2.5 times the first width.

5. The semiconductor device of claim 3, wherein the second width ranges from about 180 nm to about 300 nm.

6. The semiconductor device of claim 1, wherein the barrier structure has first horizontal regions extending in the second direction and second horizontal regions extending in the third direction, and the first horizontal regions and the second horizontal regions form a single closed curve.

7. The semiconductor device of claim 6, wherein in the first horizontal regions each of the projections protrudes in the third direction, and in the second horizontal regions each of the projections protrudes in the second direction.

8. The semiconductor device of claim 6, wherein the first horizontal regions are collinear with the separation regions.

9. The semiconductor device of claim 1, wherein each of the projections has one of a semicircular shape, a quadrangular shape, or a triangular shape.

10. The semiconductor device of claim 1, wherein the barrier structure has a plurality of seams in a region adjacent to respective ones of the projections, the plurality of seams separated from each other.

11. The semiconductor device of claim 10, wherein the plurality of seams are at a center of respective ones of the projections.

12. The semiconductor device of claim 1, wherein an external side surface of the barrier structure has external projections protruding in a direction opposite to the projections of the internal side surface of the barrier structure.

13. The semiconductor device of claim 1, wherein the first through third barrier layers are sequentially stacked along side surfaces and a bottom surface, the first barrier layer includes different materials from the second or third barrier layers, the second barrier layer includes different materials from the first or third barrier layers, and the third barrier layer includes different materials from the first or second barrier layers.

14. The semiconductor device of claim 1, wherein the memory cell structure further includes a first horizontal conductive layer horizontally arranged under the gate electrodes on the second substrate and directly contacting the channel layer of each of the channel structures, and a second horizontal conductive layer on the first horizontal conductive layer, and
the barrier structure contacts the second horizontal conductive layer and is spaced apart from the first horizontal conductive layer.

15. The semiconductor device of claim 14, wherein the barrier structure penetrates through the second horizontal conductive layer in a region in which the second horizontal conductive layer contacts the second substrate.

16. A semiconductor device comprising:
a first substrate;
active or passive circuits on the first substrate;
a second substrate above the active or passive circuits;
gate electrodes stacked on the second substrate to be spaced apart from each other in a first direction;
channel structures penetrating through the gate electrodes, the channel structures extending in the first direction, each of the channel structures including a channel layer;
a first horizontal conductive layer horizontally arranged under the gate electrodes on the second substrate and directly contacting the channel layer of each of the channel structures;
a second horizontal conductive layer on the first horizontal conductive layer;
separation regions penetrating through the gate electrodes and extending in a second direction;

a through-contact plug extending through the second substrate in the first direction and electrically connecting the gate electrodes with the active or passive circuits; and a barrier structure spaced apart from the through-contact plug and surrounding the through-contact plug, the barrier structure having first regions each having a first width, second regions each having a second width greater than the first width, wherein the barrier structure contacts the second horizontal conductive layer and is spaced apart from the first horizontal conductive layer.

17. The semiconductor device of claim 16, wherein the barrier structure includes (A) an extension portion having the first width in a direction that is perpendicular to an extension direction, and (B) projections protruding from the extension portion and having a third width less than the first width.

18. The semiconductor device of claim 17, wherein the projections are spaced apart from each other on an internal side surface of the barrier structure, the internal side surface facing the through-contact plug.

19. A data storage system comprising:

a semiconductor storage device including a first substrate;
active or passive circuits on the first substrate;
a second substrate above the active or passive circuits;
gate electrodes stacked on the second substrate to be spaced apart from each other in a first direction;
channel structures penetrating through the gate electrodes and extending in the first direction, each of the channel structures including a channel layer;
separation regions penetrating through the gate electrodes and extending in a second direction;
a through-contact plug extending through the second substrate in the first direction and electrically connecting the gate electrodes with the active or passive circuits;
a barrier structure spaced apart from the through-contact plug and surrounding the through-contact plug, the barrier structure having an internal side surface having projections and that is substantially flat between the projections and an external side surface that is substantially flat when viewed in plan view;
an input/output pad electrically connected to the active or passive circuits; and
a controller circuitry electrically connected to the semiconductor storage device through the input/output pad, the controller circuitry configured to control the semiconductor storage device.

* * * * *